(12) United States Patent
Sakai

(10) Patent No.: US 8,035,155 B2
(45) Date of Patent: Oct. 11, 2011

(54) SPLIT-GATE NONVOLATILE SEMICONDUCTOR MEMORY DEVICE

(75) Inventor: Isami Sakai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 233 days.

(21) Appl. No.: 12/320,965

(22) Filed: Feb. 10, 2009

(65) Prior Publication Data

US 2009/0200597 A1    Aug. 13, 2009

(30) Foreign Application Priority Data

Feb. 13, 2008 (JP) ................................. 2008-032342

(51) Int. Cl.
*H01L 29/788* (2006.01)
(52) U.S. Cl. ........ 257/321; 257/314; 257/315; 257/320; 257/E29.3
(58) Field of Classification Search .................. 257/314, 257/315, 320, 321, E29.3
See application file for complete search history.

(56) References Cited

U.S. PATENT DOCUMENTS

| 6,031,264 A * | 2/2000 | Chien et al. ................... 257/315 |
| 2006/0186460 A1* | 8/2006 | Choi et al. ..................... 257/315 |
| 2006/0284242 A1* | 12/2006 | Jo ................................. 257/316 |

FOREIGN PATENT DOCUMENTS

| JP | 2000-286348 A | | 10/2000 |
| JP | 2001-085543 A | | 3/2001 |
| JP | 2001-230330 | * | 8/2001 |
| JP | 2001-230330 A | | 8/2001 |

* cited by examiner

*Primary Examiner* — Tan N Tran
(74) *Attorney, Agent, or Firm* — Foley & Lardner LLP

(57) ABSTRACT

A nonvolatile semiconductor memory device includes a floating gate; an erasing gat; and a control gate. The floating gate is provided on a channel region of a semiconductor substrate through a first insulating layer. The erasing gate is provided on the floating gate through a second insulating layer. The control gate is provided beside the floating gate and the erasing gate through a third insulating layer. The floating gate is U-shaped.

17 Claims, 26 Drawing Sheets

SPLIT-GATE NONVOLATILE SEMICONDUCTOR MEMORY DEVICE

INCORPORATION BY REFERENCE

This application is based upon and claims the benefit of priority from Japanese patent application No. 2008-032342 filed on Feb. 13, 2008, the disclosure of which is incorporated herein in its entirety by reference.

BACKGROUND OF THE INVENTION

1. Field of the Invention

The present invention relates to a nonvolatile semiconductor memory device, and especially relates to a split-gate nonvolatile semiconductor memory device.

2. Description of Related Art

A split-gate nonvolatile semiconductor memory device is known as a nonvolatile semiconductor memory device. For example, Japanese Laid-Open Patent Applications JP-P2001-230330A, JP-P2000-286348A, and JP-P2001-085543A, disclose the split-gate nonvolatile semiconductor memory devices, each of which has an erasing gate.

FIG. 1 is a cross-sectional view showing a configuration of a nonvolatile semiconductor memory device disclosed in JP-P2001-230330A. This nonvolatile semiconductor memory device includes: a floating gate 120 formed on a semiconductor substrate 110 via a gate insulating film 112; an erasing gate 140 formed on the floating gate 120 via insulating films 113 and 114; a control gate (not shown in the figure) formed on one side wall portion of the floating gate 120, the insulating films 113 and 114, and the erasing gate 140 via a insulating film (not shown in the figure) formed to coat the floating gate 120, the insulating films 113 and 114, and the erasing gate 140; and a diffusion region (not shown in the figure) formed on a surface layer of the substrate 110 so as to adjoin the floating gate 120 or the control gate. This nonvolatile semiconductor memory device is provided with the erasing gate 140 directly above the floating gate 120. In the figure, sharpened portions (sharpened portions 121) in upper portions of both ends of the floating gate 120 have a structure in which an electric field tends to be concentrated. Accordingly, an erasing operation is realized by extracting electrons from the sharpened portions 121 to the erasing gate 140.

FIG. 2 is a cross-sectional view showing a configuration of a nonvolatile semiconductor memory device disclosed in JP-P2000-286348A. This nonvolatile semiconductor memory device includes a floating gate 220 and a control gate 230 on a semiconductor substrate 210 having a first diffusion region 251 and a second diffusion region 252. This nonvolatile semiconductor memory device is characterized by having an erasing gate 240 which is formed so as to adjoin the floating gates 220 of adjoining memory cells via a tunnel oxide film 214 and is connected to a first diffusion region 251 with keeping a certain interval. This nonvolatile semiconductor memory device provides the erasing gate 240 on a side of the floating gate 220. In the figure, a sharpened portion (a sharpened portion 221) on an erasing gate 240 side of the floating gate 220 have a structure in which an electric field tends to be concentrated. Accordingly, an erasing operation is realized by extracting electrons from the sharpened portions 221 to the erasing gate 240.

FIG. 3 is a cross-sectional view showing a configuration of a split-gate memory cell disclosed in JP-P2001-085543A. This split-gate memory cell includes a source region 351 and a drain region 352 formed on a semiconductor substrate 310, a channel region sandwiched by the source region 351 and the drain region 352, a floating gate electrode 320 formed on the channel region via a floating gate insulating film 311, a control gate electrode 330 formed on the channel region via a control gate insulating film 312, and an erasing gate electrode 340 formed on the floating gate electrode 320 via an erasing gate insulating film 315. The floating gate insulating film 311 and the erasing gate insulating film 315 include independently separated insulating film, respectively. The nonvolatile semiconductor memory device is characterized in that the floating gate electrode 320 is formed in a self-aligning manner with respect to the control gate electrode 330. In the figure, a sharpened portion (a sharpened portion 321) on an erasing gate 340 side of the floating gate 320 have a structure in which an electric field tends to be concentrated. Accordingly, an erasing operation is realized by extracting electrons from the sharpened portions 321 to the erasing gate 340.

In a nonvolatile semiconductor memory device, its operation speed is increasingly high in these years. For example, as for the nonvolatile semiconductor memory device incorporated in a microcomputer, since an operation speed of the microcomputer itself has been increasingly high, the operation speed of the nonvolatile semiconductor memory device is strongly required to be high. In addition, the nonvolatile semiconductor memory device is required to satisfy requirements of finely miniaturizing a circuit and of lowering an operating voltage.

The inventor has now discovered following facts.

A technique of JP-P2001-230330A discloses a structure in which the erasing gate 140 (a portion facing the sharpened portion 121) is embedded between the two floating gates 120 as shown in FIG. 1. For this reason, the erasing gate 140 and the floating gate 120 face each other at surfaces (a surface 140a and a surface 120a). In this case where the erasing gate 140 and the floating gate 120 face each other at the surfaces, there is a problem that a voltage applied between the erasing fate 140 and the floating gate 120 becomes small in the erasing operation because a coupling capacity is large. For this reason, there is a problem that the erasing operation at a high speed cannot be expected.

Techniques of JP-P2000-286348A and JP-P2001-085543A have a same problem. Specifically, in the technique of JP-P2000-286348A, since the erasing gate 240 and the floating gate 220 face each other at surfaces (a surface 240a and a surface 220a) as shown in FIG. 2, a coupling capacity is large. Similarly, in the technique of JP-P2001-085543A, since the erasing gate 340 and the floating gate 320 face each other at surfaces (a surface 340a and a surface 320a) as shown in FIG. 3, a coupling capacity is large. For this reason, there is a problem that the erasing operation at a high speed cannot be expected.

SUMMARY

The present invention seeks to solve one or more of the above problems, or to improve upon those problems at least in part. In one embodiment, a nonvolatile semiconductor memory device, includes: a floating gate configured to be provided on a channel region of a semiconductor substrate through a first insulating layer; an erasing gate configured to be provided on the floating gate through a second insulating layer; and a control gate configured to be provided beside the floating gate and the erasing gate through a third insulating layer, wherein the floating gate is U-shaped.

In the present invention, the floating gate faces the erasing gate at end portions of U-shaped, each having a quite small area, through the thin second insulating film. On the other hand, the floating gate is separated from the erasing gate by the thick second insulating film at other portions. For this reason, a portion effective to a coupling capacity between the floating gate and the erasing gate is the end portion having a quite small area. That is, a coupling capacity between the floating gate and the erasing gate can be small. Since the coupling capacity can be small, an erasing voltage in the erasing operation can be suppressed to be small.

In another embodiment, a nonvolatile semiconductor memory device, includes: a floating gate configured to be provided on a channel region of a semiconductor substrate through a first insulating layer; an erasing gate configured to be provided on the floating gate through a second insulating layer; and a control gate configured to be provided beside the floating gate and the erasing gate through a third insulating layer, wherein the floating gate includes: a bottom surface portion configured to contact with the first insulating layer, a first side portion configured to be connected to one end of the bottom surface portion at one end, and extend toward a direction away from a surface of the semiconductor substrate, and a second side portion configured to be connected to the other end of the bottom surface portion at one end, and extend toward the direction away from the surface of the semiconductor substrate.

In the present invention, the floating gate faces the erasing gate at end portions of the first and second side portions, each having a quite small area, through the thin second insulating film. On the other hand, the floating gate is separated from the erasing gate by the thick second insulating film at the other bottom surface portion. For this reason, a portion effective to a coupling capacity between the floating gate and the erasing gate is the end portion having a quite small area. That is, a coupling capacity between the floating gate and the erasing gate can be small. Since the coupling capacity can be small, an erasing voltage in the erasing operation can be suppressed to be small.

In another embodiment, a nonvolatile semiconductor memory device, includes: a floating gate configured to be provided on a channel region of a semiconductor substrate through a first insulating layer; an erasing gate configured to be provided on the floating gate through a second insulating layer; and a control gate configured to be provided beside the floating gate and the erasing gate through a third insulating layer, wherein the floating gate is L-shaped.

In the present invention, the floating gate faces the erasing gate at an end portion of L-shaped, having a quite small area, through the thin second insulating film. On the other hand, the floating gate is separated from the erasing gate by the thick second insulating film at other portions. For this reason, a portion effective to a coupling capacity between the floating gate and the erasing gate is the end portion having a quite small area. That is, a coupling capacity between the floating gate and the erasing gate can be small. Since the coupling capacity can be small, an erasing voltage in the erasing operation can be suppressed to be small.

According to the present invention, a nonvolatile semiconductor memory device can be provided which has an erasing gate ensuring a high speed operation with being accommodated to fine miniaturization and a lowered voltage.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 9A and 9B to FIGS. 22A and 22B are cross-sectional views, each of which shows each step in a method of manufacturing the nonvolatile semiconductor memory device according to the embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to attached drawings, embodiments of a nonvolatile semiconductor memory device and a method for manufacturing the nonvolatile semiconductor memory device of the present invention will be explained below.

A First Embodiment

Figure 1:
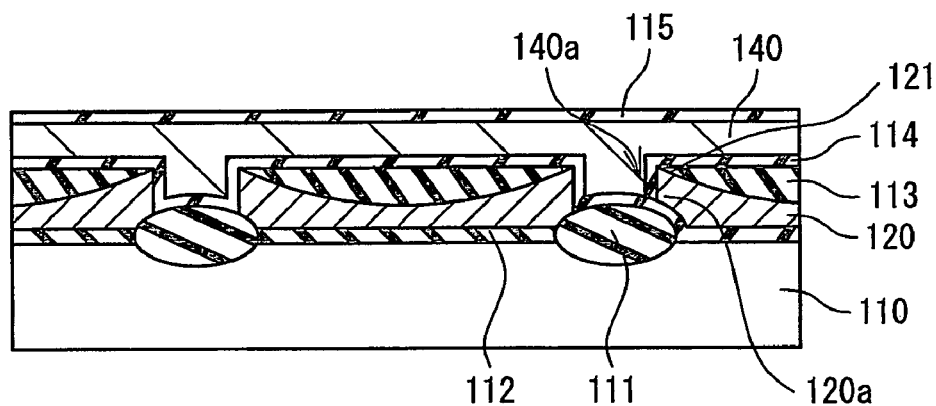
FIG. 1 is a cross-sectional view showing a configuration of a nonvolatile semiconductor memory device disclosed in JP-P2001-230330A.
Figure 2:
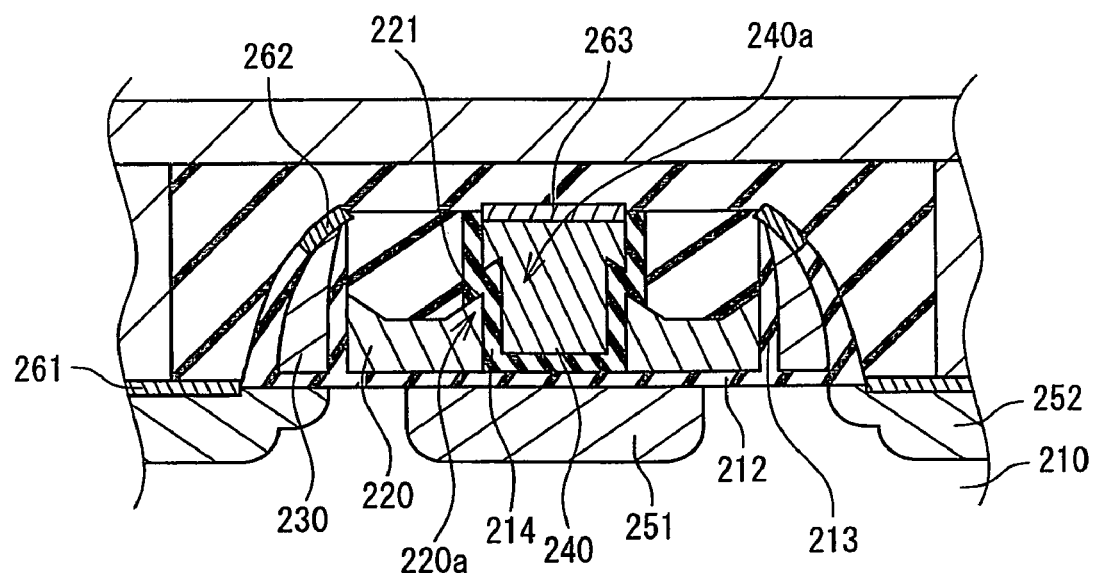
FIG. 2 is a cross-sectional view showing a configuration of a nonvolatile semiconductor memory device disclosed in JP-P2000-286348A.
Figure 3:
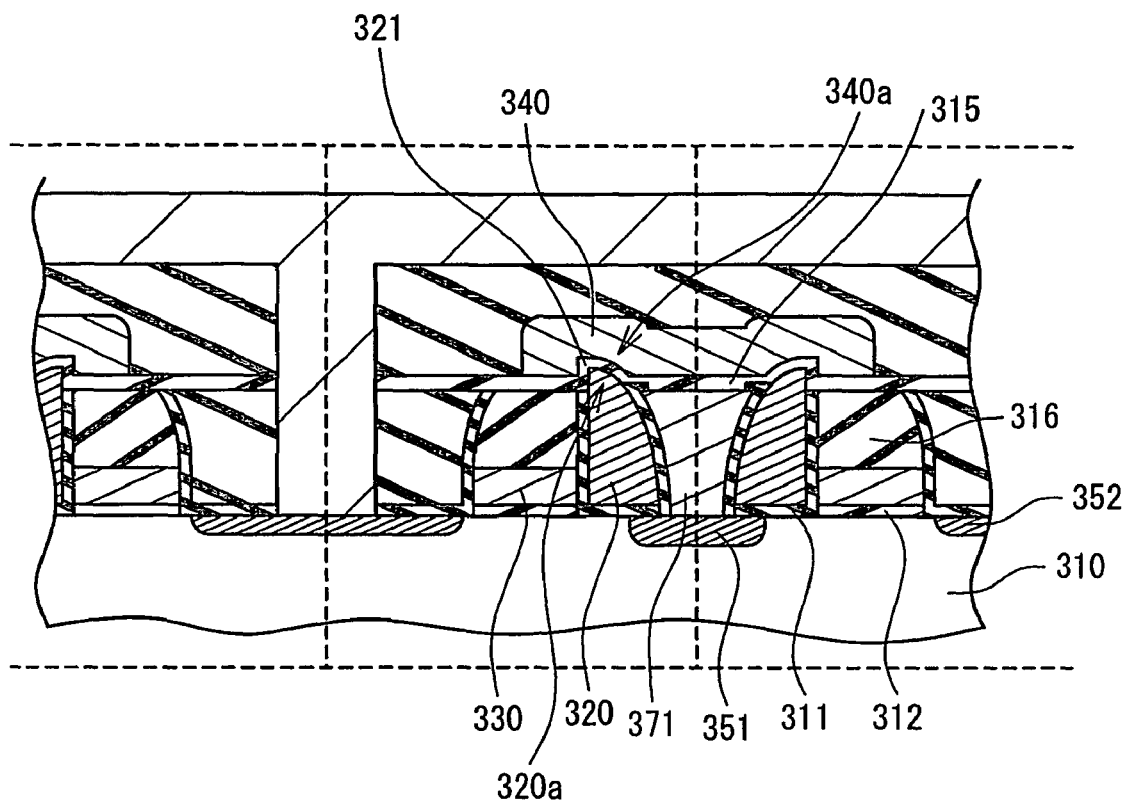
FIG. 3 is a cross-sectional view showing a configuration of a split-gate memory cell disclosed in JP-P2001-085543A.
Figure 4A:
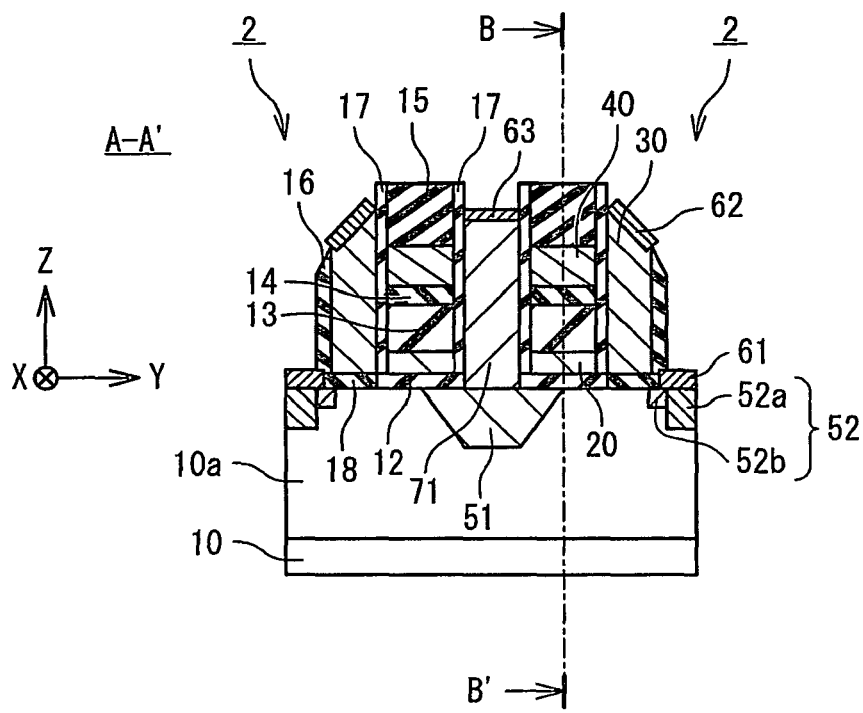
FIG. 4A is a cross-sectional view showing a configuration of a nonvolatile semiconductor memory device according to an embodiment of the present invention.
Figure 4B:
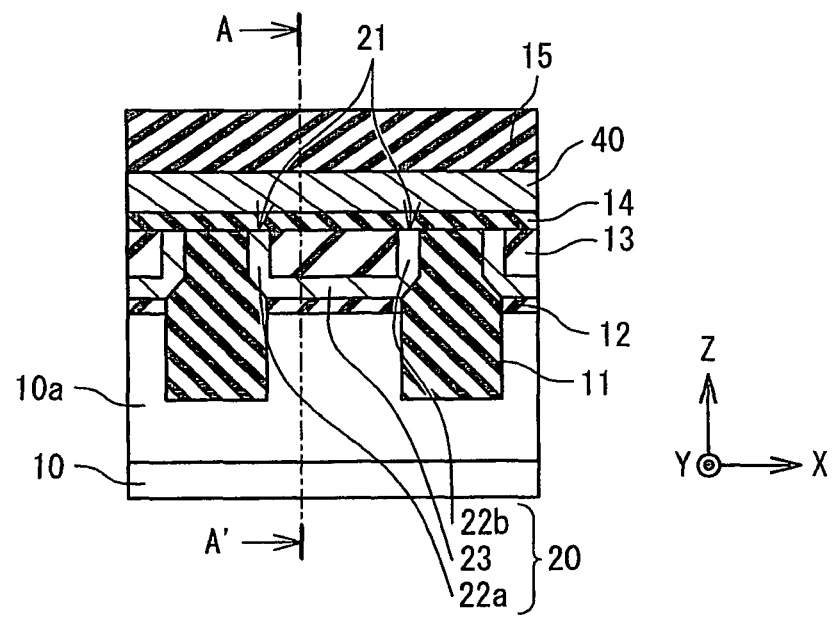
FIG. 4B is a cross-sectional view showing the configuration of the nonvolatile semiconductor memory device according to the embodiment of the present invention.
Figure 4C:
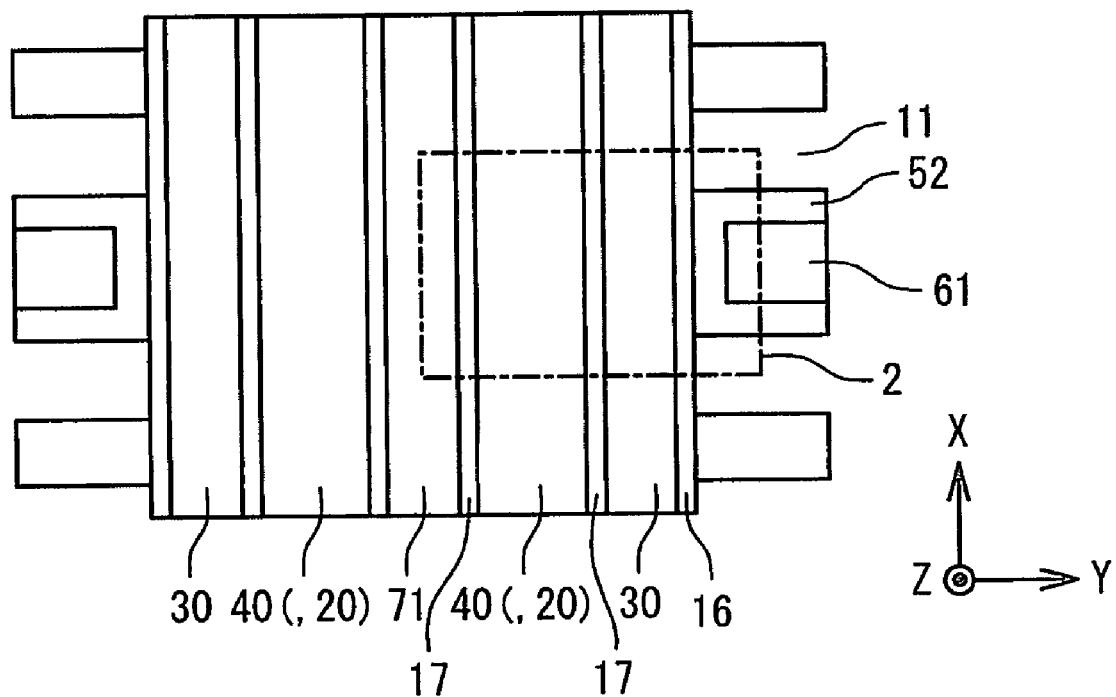
FIG. 4C is a plan view showing the configuration of the nonvolatile semiconductor memory device according to the embodiment of the present invention.

FIGS. 4A, 4B, and 4C show a configuration of a nonvolatile semiconductor memory device according to the embodiment of the present invention. Specifically, FIG. 4A is a cross-sectional view along the line A-A' shown in FIG. 4B (y-z cross-section surface), FIG. 4B is a cross-sectional view along the line B-B' shown in FIG. 4A (z-x cross-section surface), and FIG. 4C is a plan view (x-y plane). In these drawings, a memory cell 2 of a split-gate flash memory is shown as a memory cell of the nonvolatile semiconductor memory device according to the present embodiment.

Referring to FIG. 4A, the memory cell 2 includes a first gate insulating film 12, a first insulating film 13, a tunnel insulating film 14, a second insulating film 15, a first side wall insulating film 16, a second side wall insulating film 17, a second gate insulating film 18, a floating gate 20, a control gate 30, an erasing gate 40, a first source/drain diffusion layer 51, a second source/drain diffusion layer 52, and silicide films 61 and 62.

The first source/drain diffusion layer 51 and the second source/drain diffusion layer 52 are formed on both sides of a channel region on a surface of a well 10a of a semiconductor substrate 10 exemplified by a silicon substrate. In a writing operation, a reading operation, and an erasing operation of the memory cell 2, one of the first source/drain diffusion layer 51 and the second source/drain diffusion layer 52 works as a source, and the other works as a drain. In a case where the well 10a of the semiconductor substrate 10 is a p-type, the first source/drain diffusion layer 51 and the second source/drain diffusion layer 52 are n-types and their dopants are exemplified by arsenic (As) or phosphorus (P). A contact plug 71 having a silicide layer 63 in an upper portion is connected on the first source/drain diffusion layer 51. The second source/drain diffusion layer 52 includes a high concentration layer 52a and a low concentration layer (lightly doped drain) 52b. The high concentration layer 52a has a silicide layer 61 in an upper portion and is connected to a contact plug (not shown in the figure). The low concentration layer 52b projects to the channel region. The contact plug 71 is exemplified by a polysilicon film. In addition, the silicide layers 61 and 63 are exemplified by a cobalt silicide layer.

The floating gate 20 is provided on the channel region of the well 10a of the semiconductor substrate 10 via the first gate insulating film 12. The floating gate 20 partially overlaps with the first source/drain diffusion layer 51. The floating gate 20 is surrounded by the first gate insulating film 12 on a downside, the second side wall insulating films 17 and isolating layers 11 (described below) on side surfaces, and the first insulating film 13 and the tunnel insulating film 14 on an upper side, and is electrically isolated from an outside. The floating gate 20 is exemplified by the polysilicon film.

The erasing gate 40 is provided on the floating gate 20 via the first insulating film 13 and the tunnel insulating film 14. The erasing gate 40 is surrounded by the tunnel insulating film 14 on a downside, the second side wall insulating films 17 on side surfaces, and the second insulating film 15 on an upper side, and extends to an x direction (described later). The erasing gate 40 is exemplified by the polysilicon film.

The control gate 30 is provided beside the floating gate 20 and the erasing gate 40 via the second side wall insulating film 17. Further, the control gate 30 is provided on the channel region of the well 10a of the semiconductor substrate 10 via the second gate insulating film 18. The control gate 30 partially overlaps with the low concentration layer 52b of the second source/drain diffusion layer 52. The control gate 30 has the silicide layer 62 in an upper portion. The control gate 30 is surrounded by the second gate insulating film 18 on a downside and the first side wall insulating film 16 and the second side wall insulating film 17 on side surfaces, and extends to the x direction (described later). The control gate 30 is exemplified by the polysilicon film. In addition, the silicide layer 62 is exemplified by the cobalt silicide layer.

In FIG. 4A, the memory cells 2 are provided one by one (two in total) in adjoining each other to a horizontal direction (y direction) with respect to the silicide layer 63, the contact plug 71, and the first source/drain diffusion layer 51 as a center. In this case, the silicide layer 63, the contact plug 71, and the first source/drain diffusion layer 51 are shared by the two memory cells 2 on their both sides.

In the nonvolatile semiconductor memory device according to the present embodiment, the erasing gate 40 is arranged above the floating gate 20. Accordingly, the contact plug 71 can be provided on the first source/drain diffusion layer 51 and the silicide layer 63 can be formed on the contact plug 71. In addition, upper surfaces of the second source/drain diffusion layer 52, the control gate 30, and the contact plug 71 are silicided (silicide layers 61, 62, and 63). For this reason, a wiring resistance can be suppressed to be small. As a result, a parasitic resistance can be small and a high speed reading can be realized.

Furthermore, in the nonvolatile semiconductor memory device according to the present embodiment, the erasing gate 40, an electrode dedicated to the erasing, is independently provided separately from the control gate 30. For this reason, the memory device has a structure separating an erasing operation from the control gate 30.

Referring to FIG. 4B, the isolating layers (Shallow Trench Isolation) 11 for isolating the memory cells 2 in the x direction are provided in the well 10a of the semiconductor substrate 10. The isolating layer 11 extends upward (the z direction) from an inside of the well 10a of the semiconductor substrate 10 to reach a portion immediately below the tunnel insulating film 14 under the erasing gate 40 extending toward a horizontal direction (the x direction).

The floating gate 20 is U-shaped and concave upward, in a region surrounded by the first gate insulating film 12 on a downside and the isolating layer 11 (described later) on a side surface. The floating gate 20 faces the erasing gate 40 extending toward the x direction via the tunnel insulating film 14 at both U-shaped end portions 21. On the other hand, the tunnel insulating film 14 and the first insulating film 13 intervene between the erasing gate 40 and an inside portion of the U-shape other than the both end portions 21 of the floating gate 20. Meanwhile, the floating gate 20 is not necessarily required to be accurately U-shaped if having the end portions 21 facing the erasing gate 40 via the tunnel insulating film 14.

That is, the floating gate 20 includes a bottom surface portion 23, a first side portion 22a, and a second side portion 22b. The bottom surface portion 23 contacts with the first gate insulating film 12. The first side portion 22a is connected to one end of the bottom surface portion 23 at its one end, and extends toward a direction away from a surface of the semiconductor substrate 10 (e.g.: the z direction). The second side portion 22b is connected to the other end (e.g.: opposite to the connection portion with the first side portion 22a) of the bottom surface portion 23 at its one end, and extends toward a direction away from a surface of the semiconductor substrate 10 (e.g.: the z direction). The floating gate 20 faces the erasing gate 40 at the other end of the first side portion 22a and at the other end of the second side portion 22b via the tunnel insulating film 14. Accordingly, as for the insulating film between the erasing gate 40 and the floating gate 20, a thickness of a portion (the first insulating film 13 and the tunnel insulating film 14) contacting with the bottom surface portion 23 is larger by a thickness of the first insulating film 13 than a thickness of each portion (the tunnel insulating film 14) contacting with each of the other end of the first side portion 22a and the other end of the second side portion 22b.

In the nonvolatile semiconductor memory device according to the present embodiment, at the end portions 21 each having a quite small area, the floating gate 20 faces the erasing gate 40 via the thin tunnel insulating film 14. On the other hand, at other portions, the floating gate 20 is separated from the erasing gate 40 by the thick insulating film (the tunnel insulating film 14 and the first insulating film 13). For this reason, a portion effective to a coupling capacity between the floating gate 20 and the erasing gate 40 is the end portion 21 having a quite small area. That is, a coupling capacity between the floating gate 20 and the erasing gate 40 can be small. Since the coupling capacity can be small, an erasing voltage in the erasing operation can be suppressed to be small.

Further, in the nonvolatile semiconductor memory device according to the present embodiment, the oxide film under the erasing gate 40 is thin (tunnel insulating film 14) only at the portions overlapping the floating gate 20, and is thick (first insulating film 13 and tunnel insulating film 14) at other regions. For this reason, even when a high voltage is applied to the erasing gate 40, a risk of dielectric breakdown is extremely low, and even when the number of repeating increases, a possibility of the dielectric breakdown of the memory cell is extremely low.

Since it is enough for the floating gate 20 to have at least one portion facing the erasing gate 40 via the tunnel insulating film 14, either one of the first side portion 22a and the second side portion 22b is not necessarily. In that case, the floating gate 20 is L-shaped. However, when having the end portion 21 facing the erasing gate 40 via the tunnel insulating film 14, the floating gate 20 is not necessarily required to be accurately L-shaped.

In a case where the floating gate 20 is L-shaped, the floating gate 20 faces the erasing gate 40 via the thin tunnel insulating film 14 at the end portion 21 having a further quite small area compared to the case of the U-shape. Because of this, since the coupling capacity between the floating gate 20 and the erasing gate 40 can be further small compared to the case of the U-shape, an erasing voltage in the erasing operation can be suppressed to be further small.

The first gate insulating film 12, the isolating layer 11, the first insulating film 13, the tunnel insulating film 14, the second insulating film 15, the first side wall insulating film 16, and the second gate insulating film 18 are exemplified by a silicon oxide film, and the second side wall insulating film 17 is exemplified by an ONO film (Oxide Nitride Oxide film), respectively. The second side wall insulating film 17 may be the silicon oxide film, however, the ONO film is preferred because the ONO film improves an insulation resistance. In the nonvolatile semiconductor memory device according to the present embodiment, thicknesses of these films can be set freely by a manufacturing method described later to different thicknesses, respectively. Especially, a thickness of the insulating film (the second gate insulating film 18) between the control gate 30 and the semiconductor substrate 10 (the well 10a) can be set to be appropriate. Accordingly, an electric current in the memory cell 2 in the reading operation can be large even under a low voltage.

Referring to FIG. 4C, a region indicated by a dashed line shows one (1 bit) of the memory cells 2 explained in FIGS. 4A and 4B. Specifically, a region which is sandwiched by the two isolating layers 11 and includes the adjoining erasing gate 40 and the control gate 30, and the contact plug 71 (the first source/drain region 51) and the second source/drain region 52 on both sides of the gates is the memory cell 2 of 1 bit. Meanwhile, the silicide films 61, 62, and 63 and the second insulating film 15 are omitted in the figure.

The control gate 30, the erasing gate 40, the contact plug 71 extend to the x direction, and are shared by a plurality of the memory cells 2 aligned toward the x direction. Although not shown in the figure, the floating gate 20 is provided to each of the memory cell 2 under the erasing fate 40. The control gate 30, the erasing gate 40, and the contact plug 71 also have a function of a wiring layer to the respective memory cells 2. The isolating layers 11 extend to the y direction, and are aligned in parallel with each other toward the x direction. The isolating layer 11 electrically isolates a plurality of the memory cells 2 aligned toward the x direction, respectively. The first side wall insulating film 16 and the second side wall insulating film 17 (the tunnel insulating film 14) extend toward the x direction, and are shared by a plurality of the memory cells 2 aligned toward the x direction.

Figure 5:
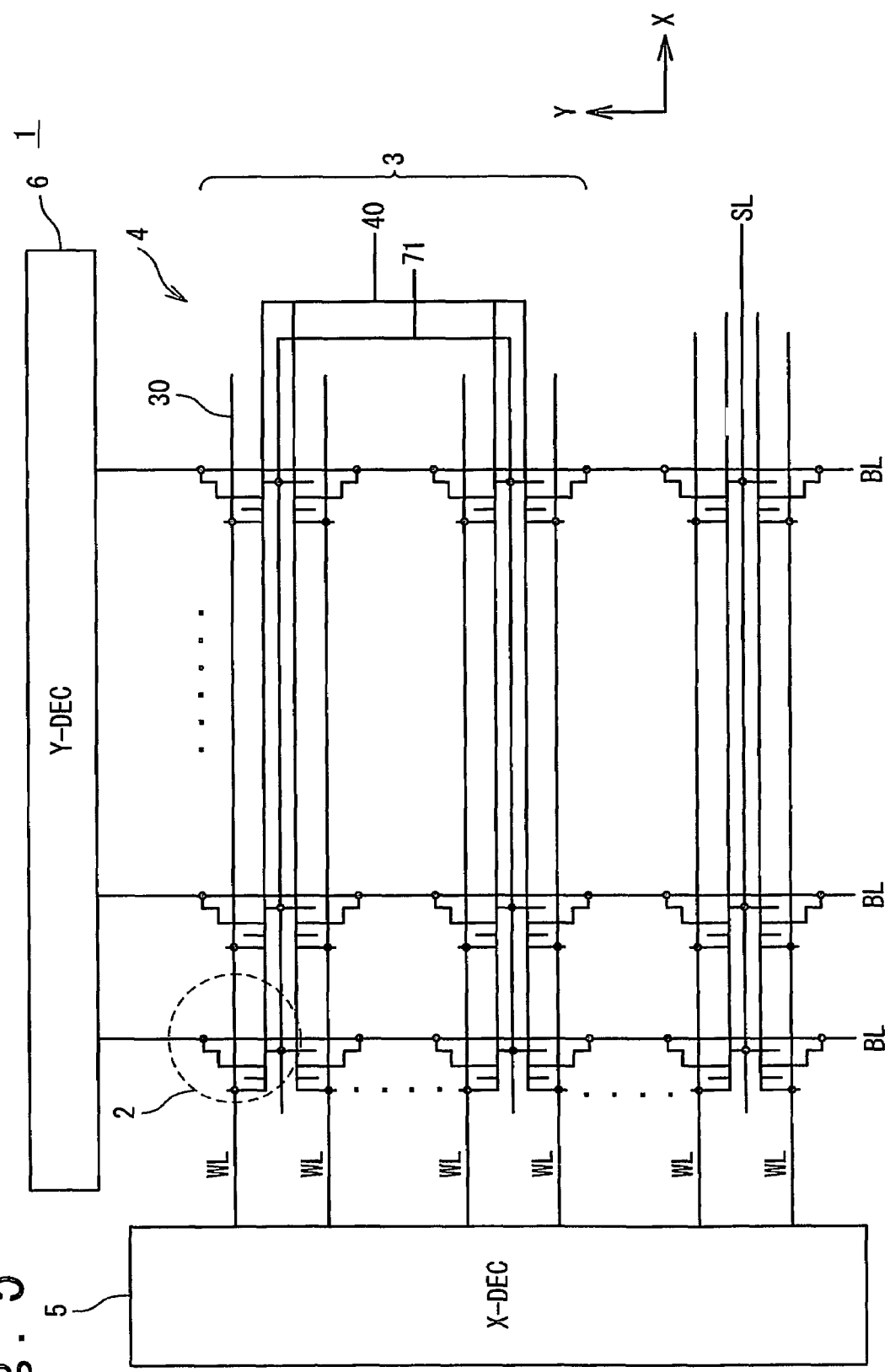
FIG. 5 is a circuit block diagram showing a configuration of an array of the nonvolatile semiconductor memory devices according to the embodiment of the present invention.

FIG. 5 is a block diagram showing a configuration of an array of the nonvolatile semiconductor memory devices according to the embodiment of the present invention. The memory array 1 includes a memory section 4, an X decoder 5, and a Y decoder 6. The X decoder 5 is connected to a plurality of word lines WL extending toward the x direction. The Y decoder 6 is connected to a plurality of bit lines BL extending toward the y direction. The memory section 4 includes the plurality of the word lines WL (corresponding to the control gate 30) extending toward the x direction, the erasing gate 40 and the contact plug 71, the plurality of the bit lines BL extending toward the y direction, and a plurality of sectors 3. The sector 3 includes a plurality of the memory cells 2 arranged on a matrix. Each of the plurality of the memory cells 2 is provided on each of intersections of the plurality of the word lines WL with the plurality of the bit lines BL.

Figure 6:
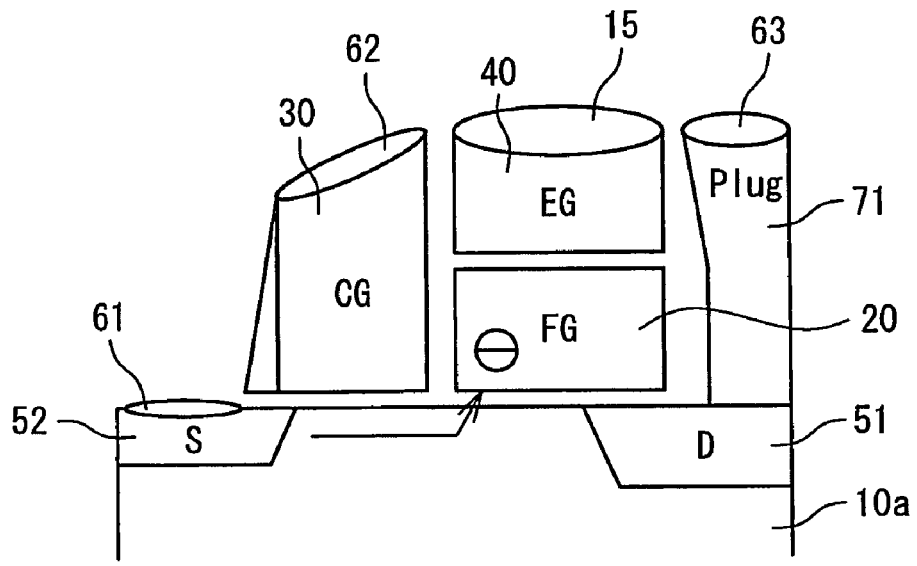
FIG. 6 is a schematic diagram for explaining a writing operation of the nonvolatile semiconductor memory device according to the embodiment of the present invention.

Next, operations (writing, reading, and erasing) of the nonvolatile semiconductor memory device according to the embodiment of the present invention will be explained. FIG. 6 is a schematic diagram for explaining a writing operation of the nonvolatile semiconductor memory device according to the embodiment of the present invention. This figure schematically shows a part of FIG. 4A (a cross-section along the line A-A' shown in FIG. 4B). The writing is realized by the source-side channel hot electron (CHE) injection. In the writing operation, the first source/drain diffusion layer 51 works as a drain (D) and the second source/drain diffusion layer 52 works as a source (S), respectively. For example, an electric voltage of +1.6 V is applied to the control gate 30, an electric voltage of +7.6 V is applied to the first source/drain diffusion layer 51, and an electric voltage of +0.5 V is applied to the second source/drain diffusion layer 52. Electrons emitted from the second source/drain diffusion layer 52 are accelerated by a strong electric field in a channel region to become the CHE. Especially, since an electric potential of the floating gate 20 is high due to capacity coupling between the first source/drain diffusion layer 51 and the floating gate 20, a strong electric field is generated in a narrow gap between the control gate 30 and the floating gate 20. The high-energy CHE generated by the strong electric field is injected to the floating gate 20 through the first gate insulating film 12. This injection is referred to as the source-side injection (SSI), and the SSI improves an electron injection efficiency and enables an applied voltage to be low. A threshold voltage of the memory cell is increased by injecting electrons to the floating gate 20.

In addition, an electric voltage (for example, 4 to 5 V) may be applied to the erasing gate 40 in the writing operation. That is, the erasing gate 40 may play a role to raise an electric potential of the floating gate 20. In this case, a punch-through resistance between the first source/drain diffusion layer 51 and the second source/drain diffusion layer 52 (between a source and a drain) can be improved because an electric voltage applied to the first source/drain diffusion layer 51 can be dropped.

Figure 7:
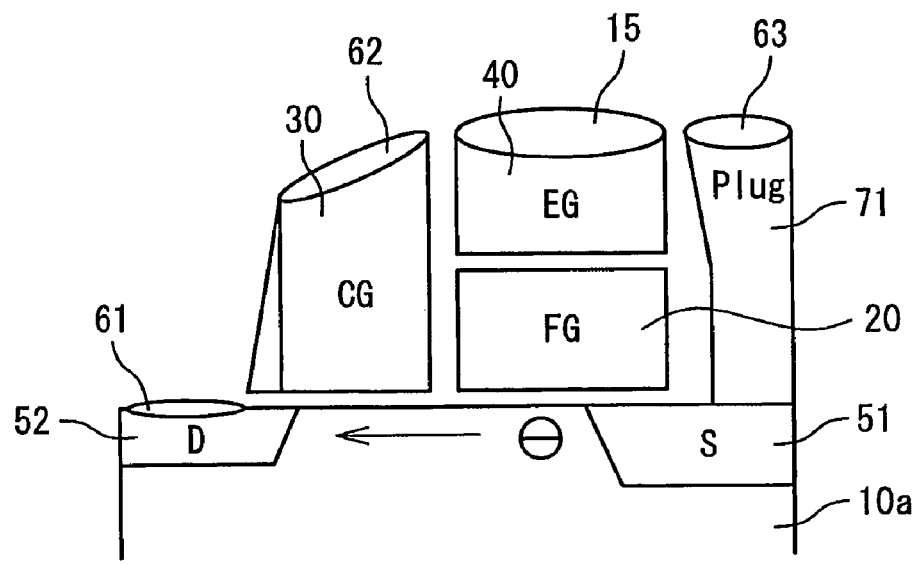
FIG. 7 is a schematic diagram for explaining a reading operation of the nonvolatile semiconductor memory device according to the embodiment of the present invention.

FIG. 7 is a schematic diagram for explaining a reading operation of the nonvolatile semiconductor memory device according to the embodiment of the present invention. This figure schematically shows a part of FIG. 4A (a cross-section along the line A-A' shown in FIG. 4B). In the reading operation, the first source/drain diffusion layer 51 works as a source (S) and the second source/drain diffusion layer 52 works as a drain (D), respectively. For example, an electric voltage of +2.5 V is applied to the control gate 30, an electric voltage of +0.8 V is applied to the second source/drain diffusion layer 52, and electric voltages of the first source/drain diffusion layer 51 and the well 10a of the semiconductor substrate 10 are set to 0 V. In a case of an erased cell (for example, a memory cell in a state where electric charges are not injected to the floating gate 20), the threshold voltage is low and a reading current (a memory cell current) flows. On the other hand, in a case of a written (programmed) cell (for example, a memory cell in a state where electric charges are injected to the floating gate 20), the threshold voltage is high and the reading current (the memory cell current) scarcely flows. By detecting this reading current (the memory cell current), it can be determined whether a cell is the programmed cell or the erased cell (determined whether stored data is "0" or "1").

Figure 8A:
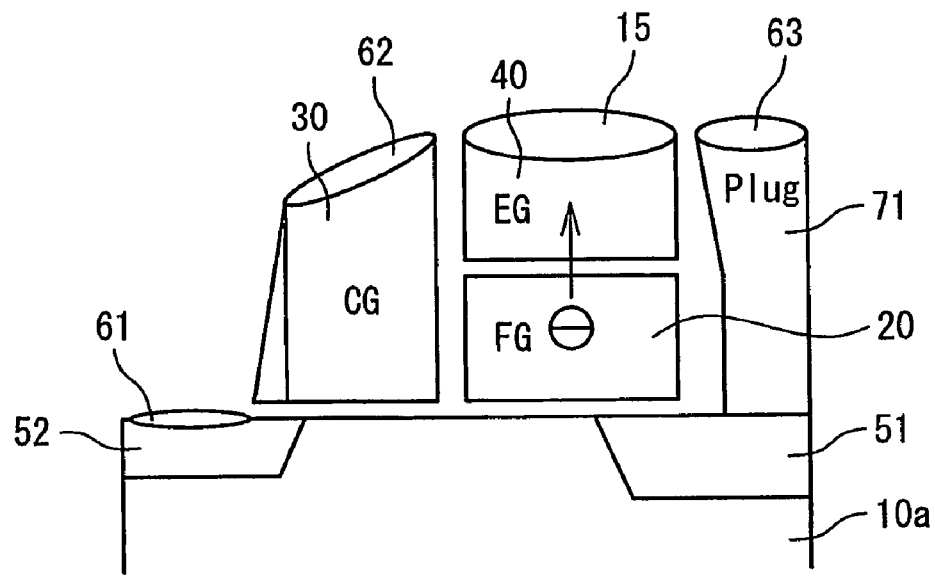
FIG. 8A is a schematic diagram for explaining an erasing operation of the nonvolatile semiconductor memory device according to the embodiment of the present invention.
Figure 8B:
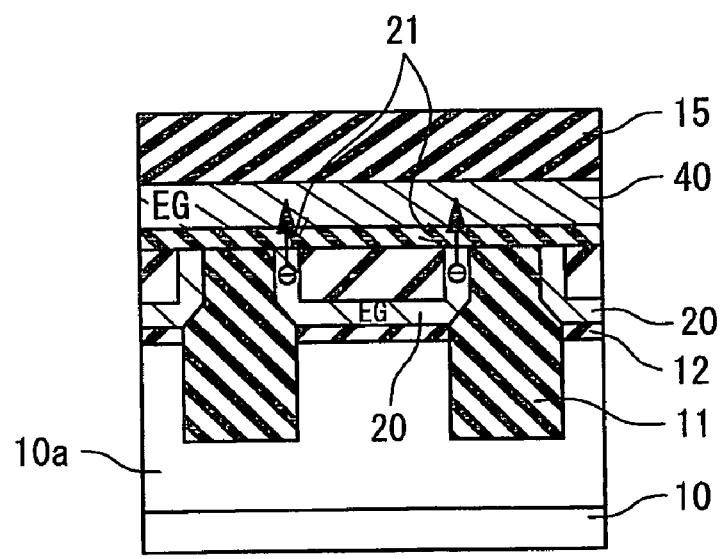
FIG. 8B is a schematic diagram for explaining the erasing operation of the nonvolatile semiconductor memory device according to the embodiment of the present invention.

FIGS. 8A and 8B are schematic diagrams for explaining an erasing operation of the nonvolatile semiconductor memory device according to the embodiment of the present invention. FIG. 8A schematically shows a part of FIG. 4A (a cross-section along the line A-A' shown in FIG. 4B), and FIG. 8B schematically shows a part of FIG. 4B (a cross-section along the line B-B' shown in FIG. 4A). The erasing is performed in the FN tunneling (Fowler-Nordheim Tunneling) method. For example, an electric voltage of 11.5 V is applied to the erasing gate 40, and voltages of the control gate 30, the first source/drain diffusion layer 51, the second source/drain diffusion layer 52, and the well 10a of the semiconductor substrate 10 are set to 0 V. As the result, a strong electric field is applied to the tunnel insulating film 14 between the erasing gate 40 and the floating gate 20 and a FN tunneling current flows. According to this, electric charges (electrons) in the floating gate 20 are extracted by the erasing gate 40 through the tunnel insulating film 14. In addition, as described above, voltages of the control gate 30, the first source/drain diffusion layer 51, the second source/drain diffusion layer 52, and the well 10a are 0 V in the erasing operation. A difference of electric potential between the control gate 30 and the well 10a is 0 V because an electric voltage is not applied to the control gate 30, and deterioration of the second gate insulating film 18 (the insulating film between the control gate 30 and the semiconductor substrate 10) caused by the erasing operation is not generated.

Since the end portion 21 of the floating gate 20 has a small area, a strong electric field is generated between the end portion 21 and the erasing gate 40 and the electric charges (electrons) in the floating gate 20 is mainly emitted from the end terminal 21 to the erasing gate 40. Accordingly, it can be said that the end portion 21 generating the strong electric field improves an extraction efficiency of the electric charges (electrons). A threshold voltage of the memory cell is dropped by extracting the electric charges (electrons) from the floating gate 20.

Meanwhile, when the threshold voltage related to the floating gate 20 is negative due to the over erasing, a channel may be constantly generated in the well 10a of the semiconductor substrate 10 at a lower portion of the floating gate 20. However, since the control gate 30 is also provided on the channel region, the memory cell can be prevented from being constantly in an ON state. In this manner, the nonvolatile semiconductor memory device according to the embodiment of the present invention has an advantage in preventing an error caused by the over-erasing.

Next, a method of manufacturing the nonvolatile semiconductor memory device according to the embodiment of the present invention will be explained. FIGS. 9A and 9B to FIGS. 22A and 22B are cross-sectional views, each of which shows each step in the method for manufacturing the nonvolatile semiconductor memory device according to the embodiment of the present invention. However, FIGS. 9A to 22A (figures A) correspond to a cross-sectional view along the line A-A' (y-z cross-section) shown in FIG. 4B. FIGS. 9B to 22B (figures B) correspond to a cross-sectional view along the line B-B' (z-x cross-section) shown in FIG. 4A.

Figure 9A:
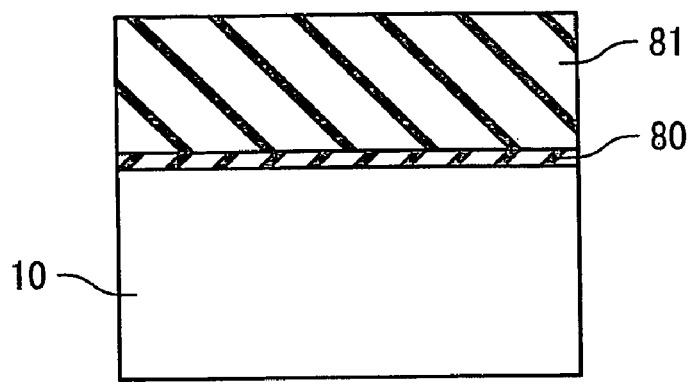
Figure 9B:
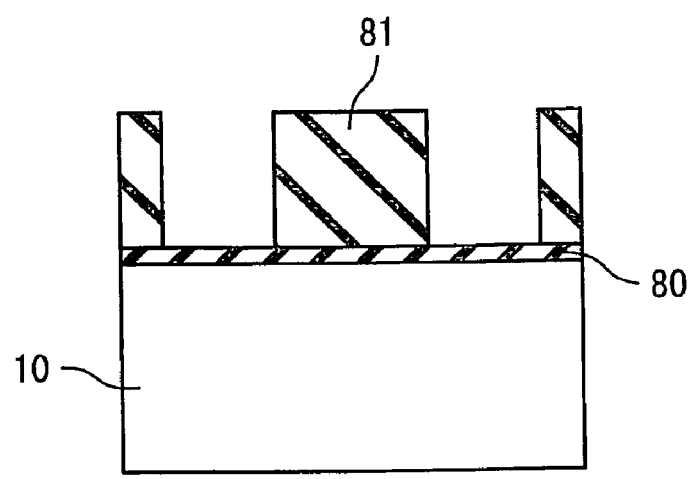

Referring to FIGS. 9A and 9B, an oxide film 80 is formed on a p-type silicon substrate as the semiconductor substrate 10 by the PAD (Polymer-Assisted-Deposition) method. Subsequently, a field nitride film 81 is formed on the oxide film 80 by the CVD method. After that, a mask pattern for the isolating layer 11 is formed on the field nitride film 81 by using the photoresist, and a pattern for the isolating layer 11 is formed on the field nitride film 81 by the etching.

Figure 10A:
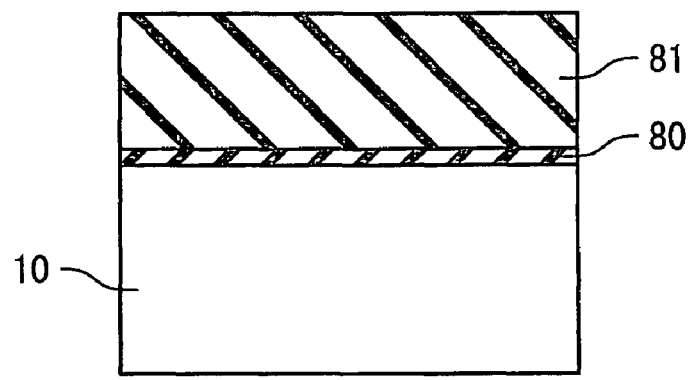
Figure 10B:
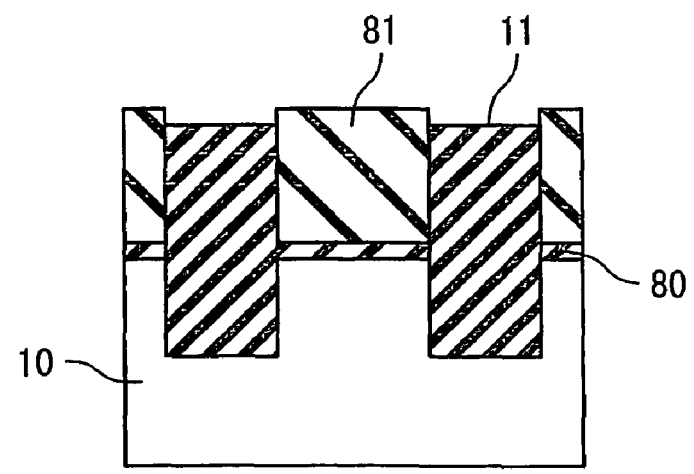

Next, referring to FIGS. 10A and 10B, trenches for the isolating layers 11 are formed by etching the oxide film 80 by applying the field nitride film 81 as a mask and by further etching the semiconductor substrate 10. Subsequently, an oxide film is formed by the CVD method so that the field nitride film 81 and the trenches are covered with the oxide film. Then, the oxide film is polished by the CMP method (Chemical Mechanical Polishing) until a surface of the field nitride film 81 is exposed. As the result, the isolating layers 11 are formed by the oxide film in the trenches. Lower portions of the isolating layers 11 are embedded in the semiconductor substrate 10 and upper portions of the isolating layers 11 project from the semiconductor substrate 10.

Figure 11A:
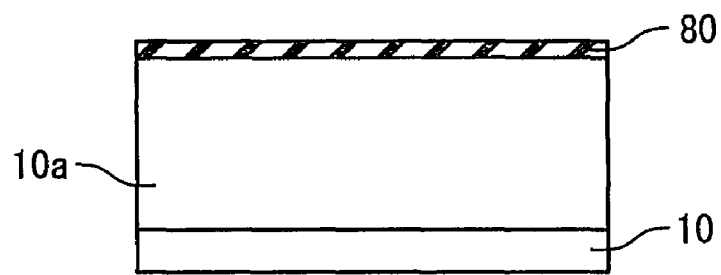
Figure 11B:
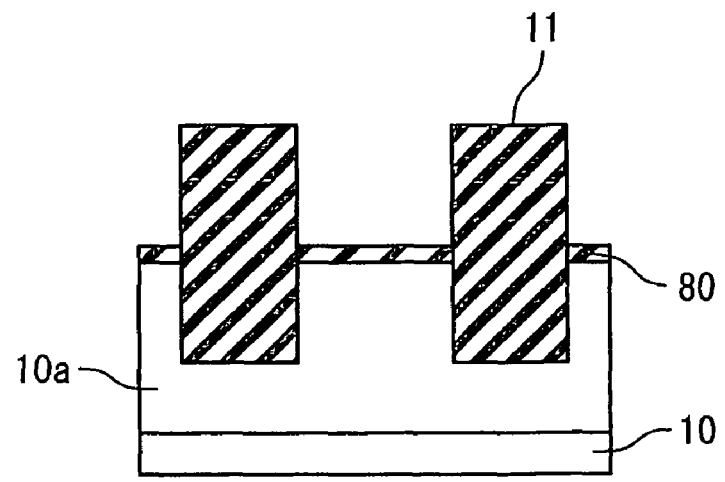

Subsequently, referring to FIGS. 11A and 11B, the field nitride film 81 is removed by the etching. Consequently, a part of the isolating layer 11 projects upward (+z direction) from a surface of the semiconductor substrate 10. After that, a mask pattern of the memory cell is formed by using the photoresist. Then, the p-type well 10a is formed in a region of the memory cell by the ion implantation of impurities for the p-type well.

Figure 12A:
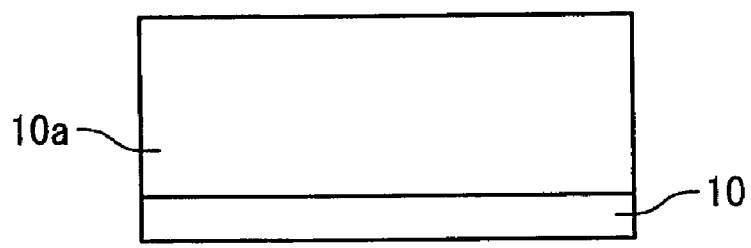
Figure 12B:
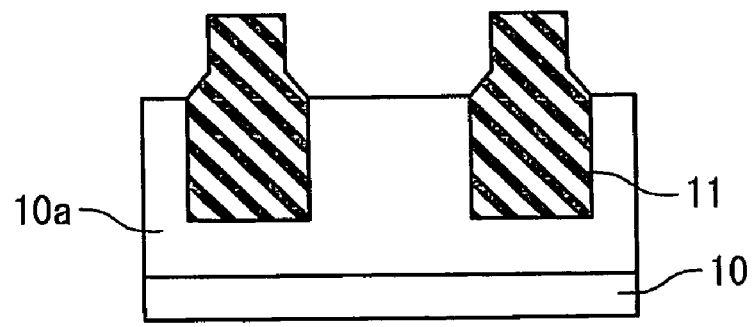

After that, referring to FIGS. 12A and 12B, the oxide film 80 is removed by the etching. At that time, also in the isolating layers 11, an oxide layer with a thickness approximately same as the film thickness of the oxide film 80 is etched from side surfaces and upper surfaces of the projecting portions of the isolating layers 11. As the result, the projecting portions of the isolating layers 11 have a thin shape compared to the portions embedded in the well 10a of the semiconductor substrate 10. In addition, boundary portions with the well 10a of the projecting portions of the isolating layers 11 slant to a surface of the well 10a. The slant may be rounded to be convex downward.

Figure 13A:
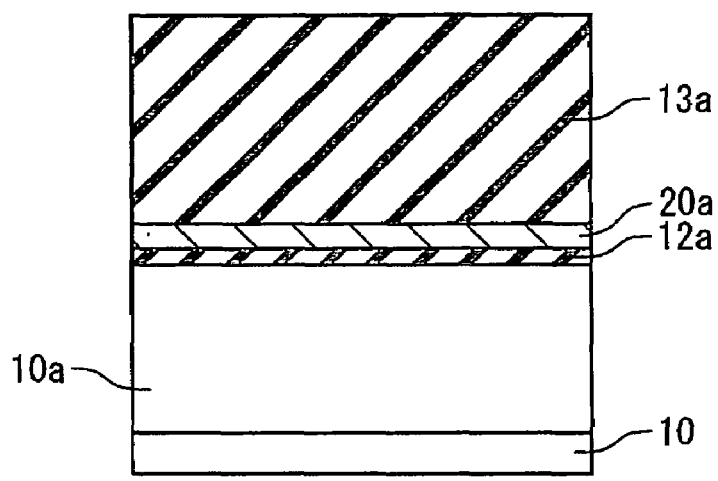
Figure 13B:
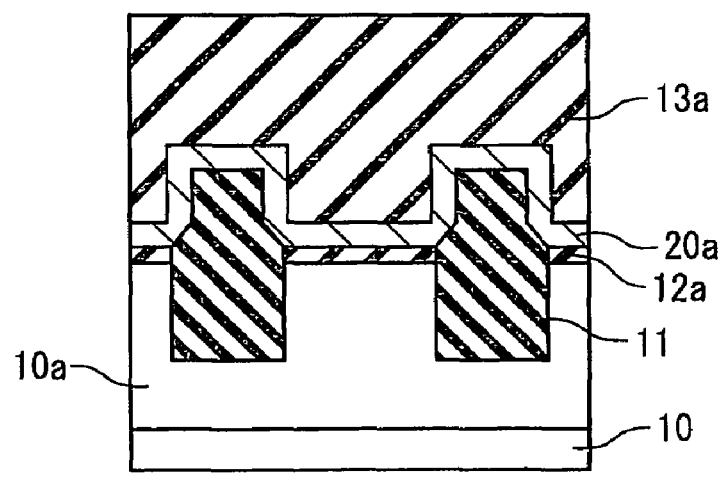

Next, referring to FIGS. 13A and 13B, an oxide film 12a is formed on the surface of the well 10a by the thermal oxidation method. Subsequently, a polysilicon film 20a is formed on the oxide film 12a and the isolating layers 11 by the CVD method. For example, the film thickness thereof is 50 nm. After that, an oxide film 13a is formed on the polysilicon film 20a by the CVD method. For example, the film thickness thereof is 150 nm. These oxide film 12a, the polysilicon film 20a, and the oxide film 13a are processed to be the first gate insulating film 12, the floating gate 20, and the first insulating film 13 by following steps.

Subsequently, referring to FIGS. 14A and 14B, the oxide film 13a is polished by the CMP method until a surface of the polysilicon film 20a on the isolating layers 11 is exposed. After that, the polysilicon film 20a on the isolating layers 11 is removed by the etching, and a height of an upper portion of the polysilicon film 20a from a surface of the well 10a is conformed to a height of the isolating layer 11. On this occasion, the oxide film 13a is etched so that a height of an upper portion of the oxide film 13a from the surface of the well 10a is also conformed to the height of the isolating layer 11.

Figure 15A:
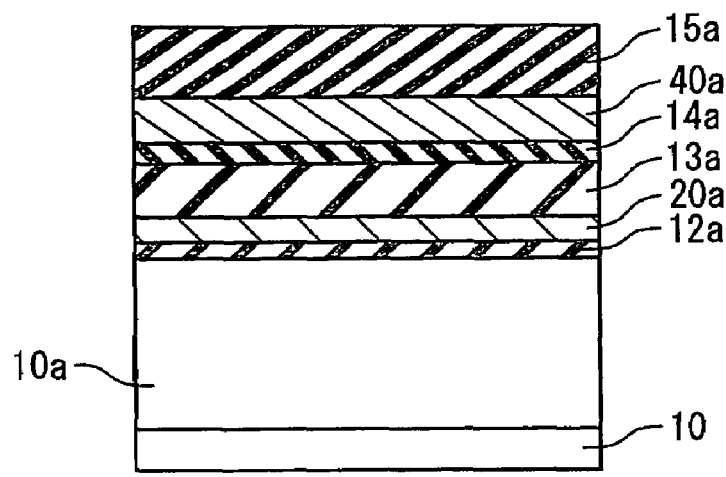
Figure 15B:
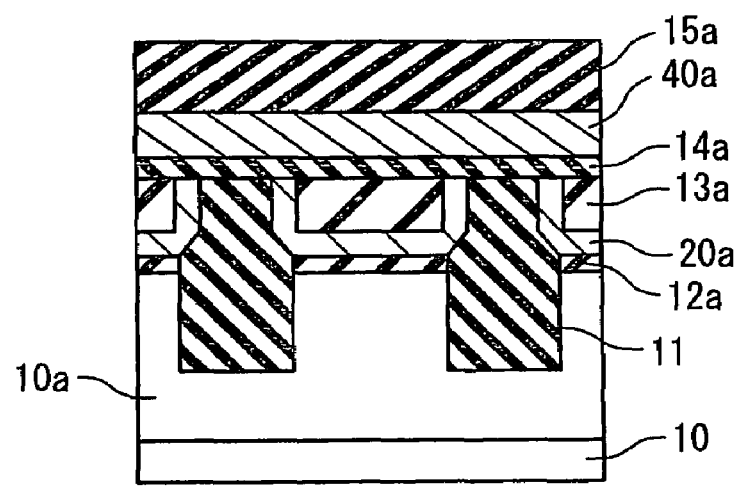

After that, referring to FIGS. 15A and 15B, an oxide film 14a is formed by the CVD method so that the polysilicon film 20a and the oxide film 13a are covered with the oxide film 14a. For example, the film thickness thereof is 15 nm. Next, a polysilicon film 40a is formed on the oxide film 14a by the CVD method. For example, the film thickness thereof is 100 nm. Subsequently, an oxide film 15a for the hard mask is formed on the polysilicon film 40a by the CVD method. For example, the film thickness thereof is 50 nm. These oxide film 14a, polysilicon film 40a, and oxide film 15a are processed to be the tunnel insulating film 14, the erasing gate 40, and the second insulating film 15 by following steps.

Figure 16A:
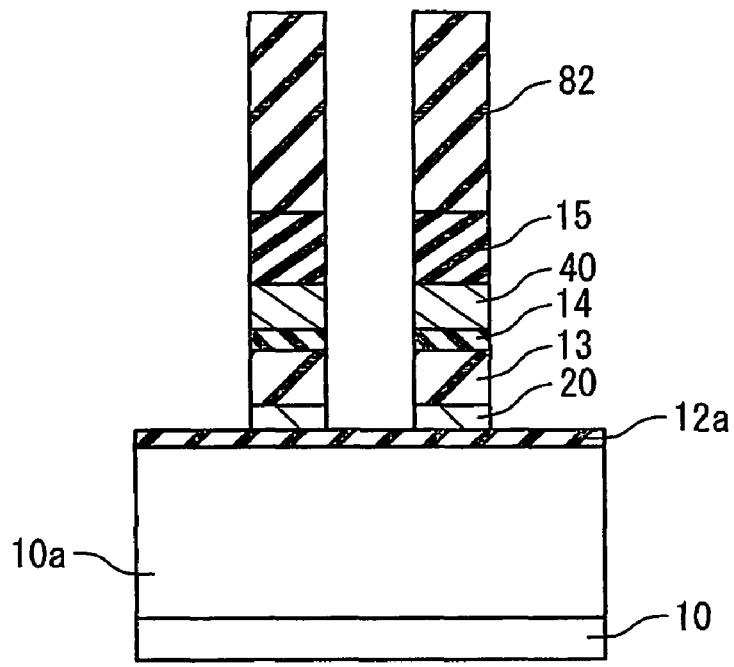
Figure 16B:
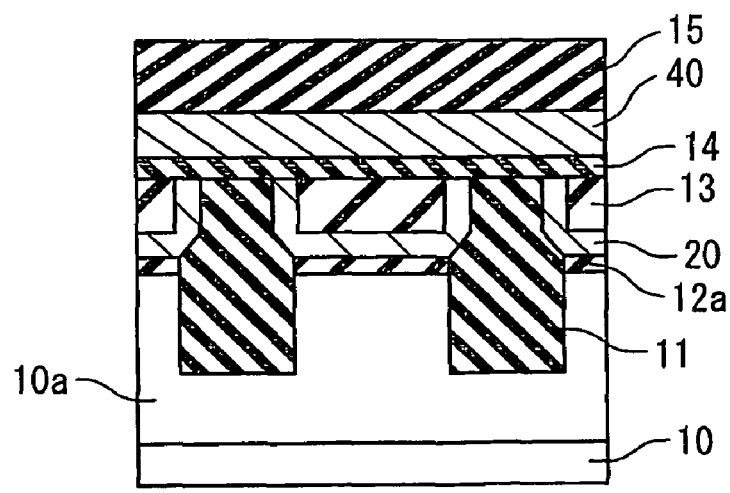

Next, referring to FIGS. 16A and 16B, a mask pattern of the erasing gate is formed by a photoresist 82. Then, the oxide film 15a, the polysilicon film 40a, the oxide film 14a, the oxide film 13a, and the polysilicon film 20a are sequentially etched by applying the photoresist 82 to a mask. As the result, the second insulating film 15 is formed from the oxide film 15a, the erasing gate 40 is formed from the polysilicon film 40a, the tunnel insulating film 14 is formed from the oxide film 14a, the first insulating film 13 is formed from the oxide film 13a, and the floating gate 20 is formed from the polysilicon film 20a, respectively.

Figure 17A:
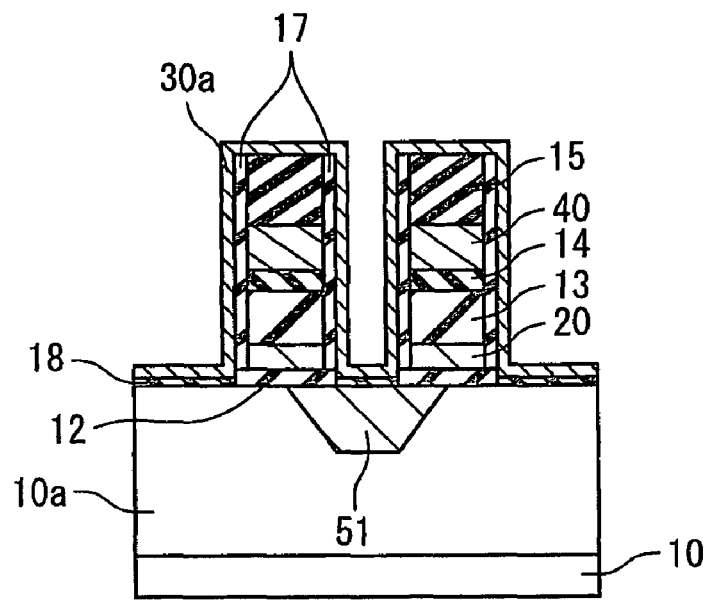
Figure 17B:
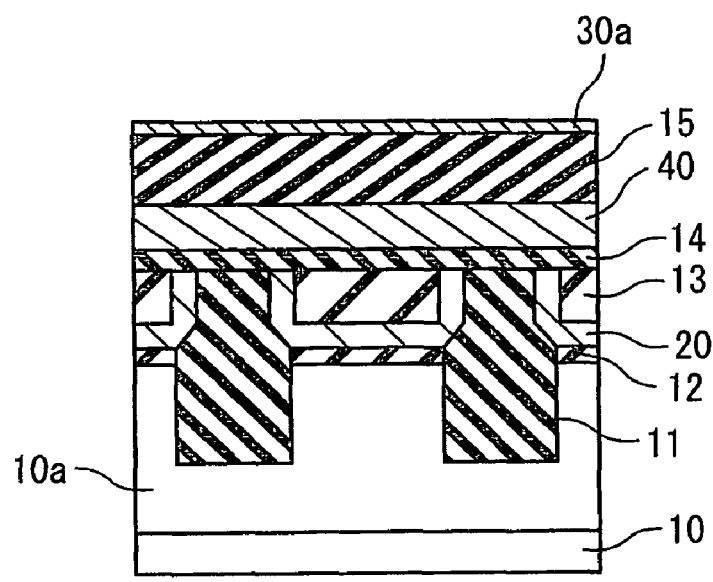

Subsequently, referring to FIGS. 17A and 17B, an ONO film is formed on an entire surface by the CVD method. Then, the second side wall insulating films 17 is formed on side surfaces of the second insulating film 15, the erasing gate 40, the tunnel insulating film 14, the first insulating film 13, and the floating gate 20 by etching back the ONO film. The oxide film 12a on a surface of the well 10a under the ONO film is also removed by this etching back, and the surface of the well 10a is exposed. As the result, the first gate insulating film 12 is formed from the oxide film 12a. After that, the second gate insulating film 18 is formed on the surface of the exposed well 10a by the thermal oxidation method. Subsequently, a polysilicon film 30a is formed on an entire surface by the CVD method. For example, the film thickness thereof is 50 nm. The polysilicon film 30a serves as a protector for side surfaces of the second sidewall insulating film 17. In addition, after the second side wall insulating film 17 is formed, ions of p-type impurities may be implanted on the surface of the well 10a at a position forming the control gate 30. Accordingly, the threshold voltage can be controlled to be a desired value by controlling a concentration of the impurities. Meanwhile, the polysilicon film 30a is not necessarily required.

Figure 18A:
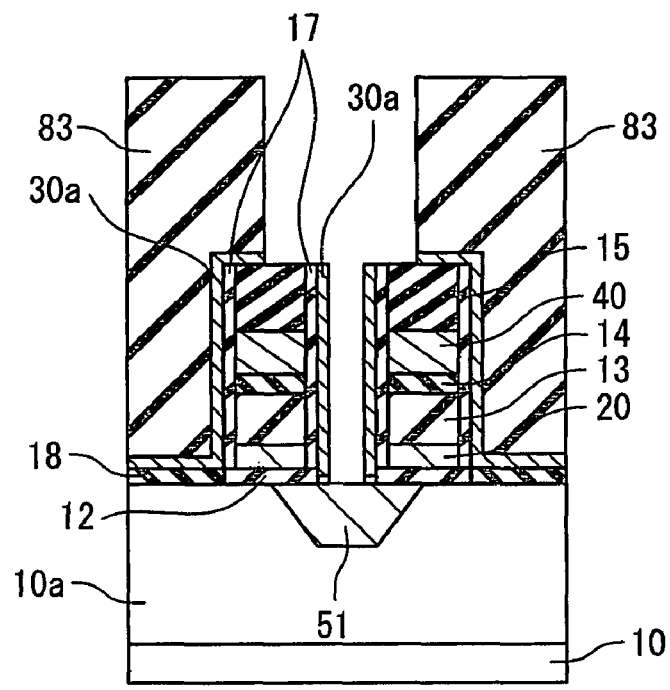
Figure 18B:
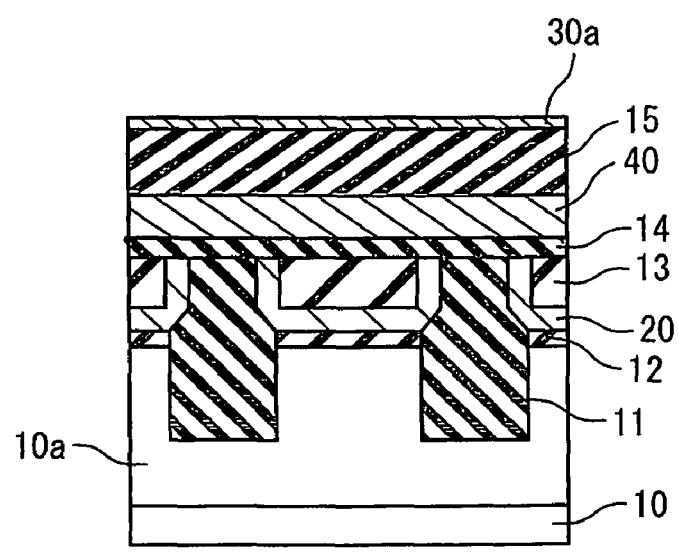

After that, referring to FIGS. 18A and 18B, a mask pattern for a contact plug 71 and its neighborhood is formed by the photoresist 83. Then, ions of n-type impurities are implanted on the surface of the well 10a at a position forming the contact plug 71 by applying the photoresist 83 to a mask, and the heat treatment is performed. In this manner, the first source/drain diffusion layer 51 is formed. Next, the polysilicon film 30a on the second insulating film 15 and the polysilicon film 30a and the second gate insulating film 18 on the well 10a at the position forming the contact plug 71 are etched back by applying the photoresist 83 to a mask.

Figure 19A:
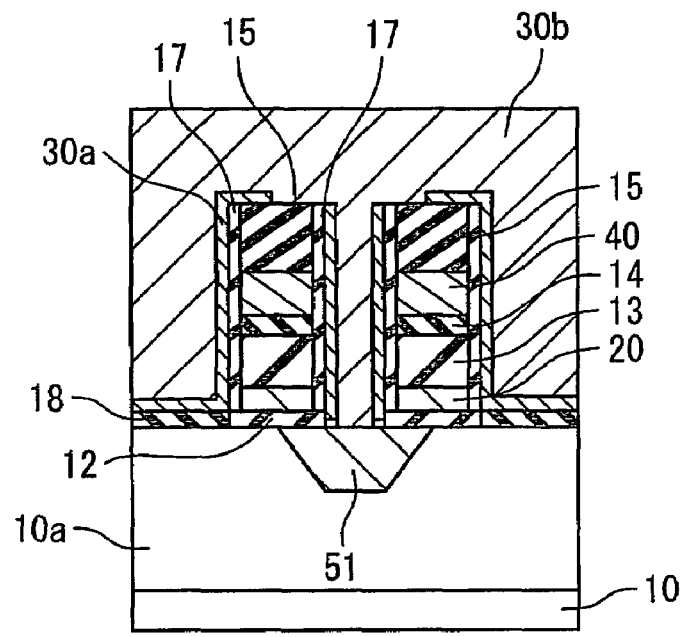
Figure 19B:
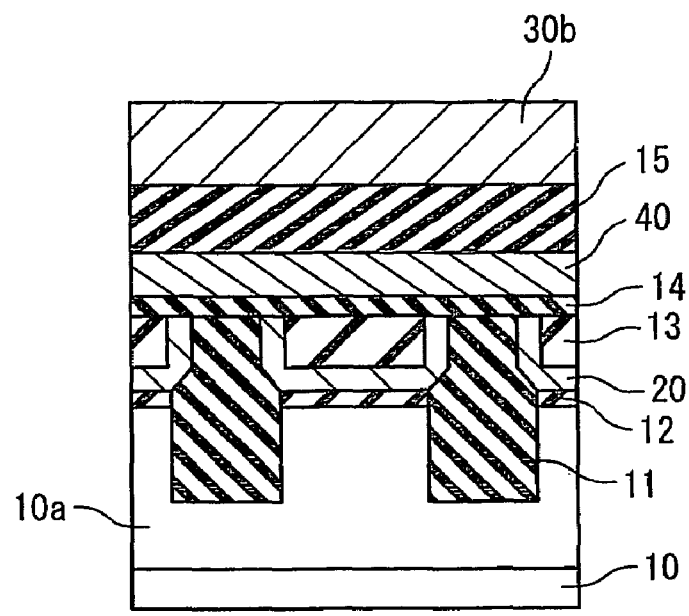
Figure 20A:
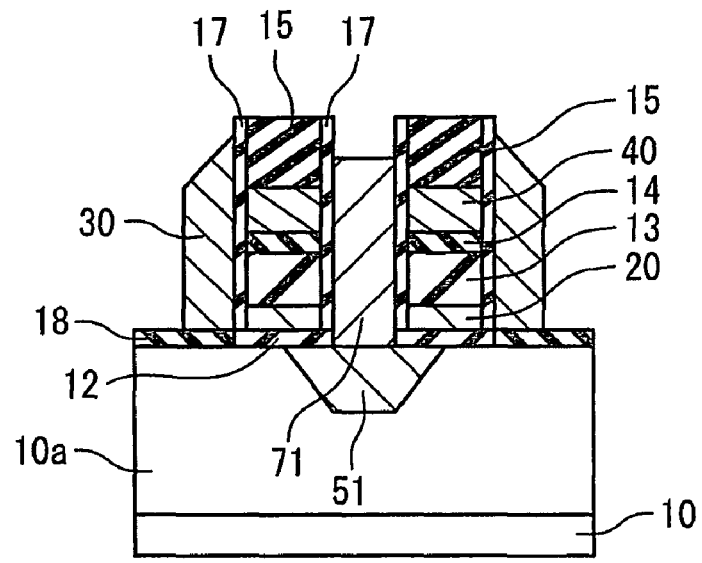
Figure 20B:
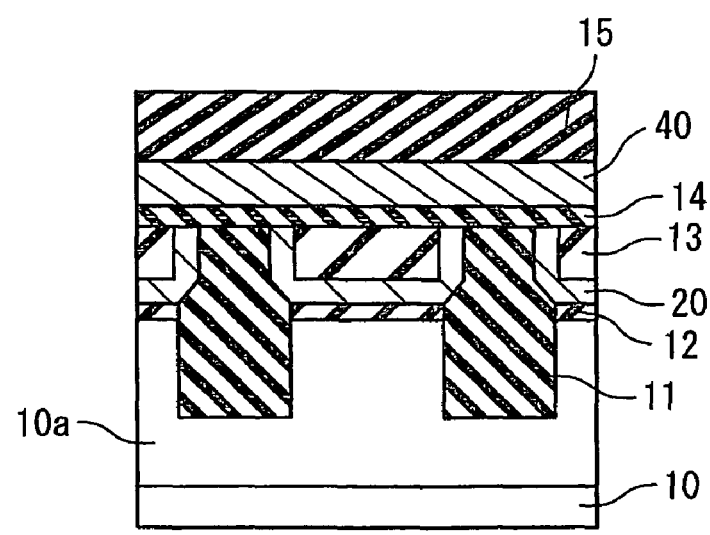

Next, referring to FIGS. 19A and 19B, a polysilicon film 30b is formed on an entire surface by the CVD method. For example, a film thickness thereof is 200 nm. Subsequently, referring to FIGS. 20A and 20B, the polysilicon films 30a and 30b are etched back. In this manner, the contact plug 71 is formed on the first source/drain diffusion layer 51. In addition, the control gate 30 is formed on a side surface of a laminated structure of the second insulating film 15, erasing gate 40, tunnel insulating film 14, first insulating film 13, and floating gate 20 via the second side wall insulating film 17.

Figure 21A:
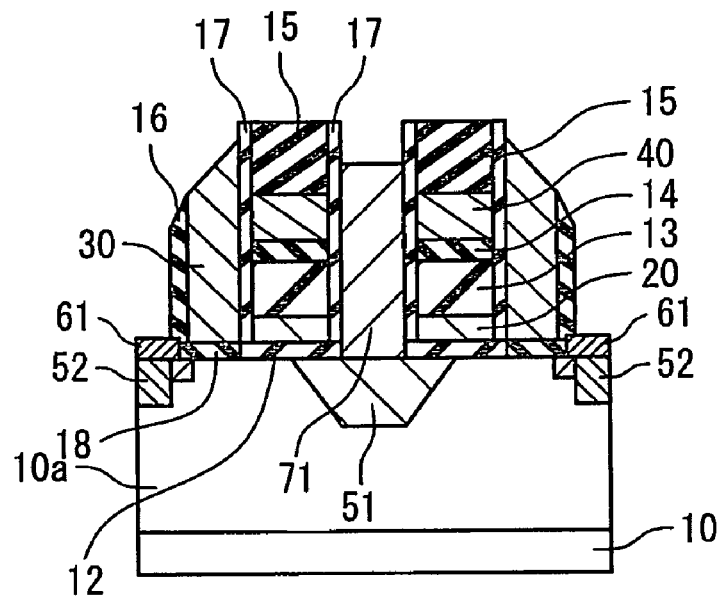
Figure 21B:
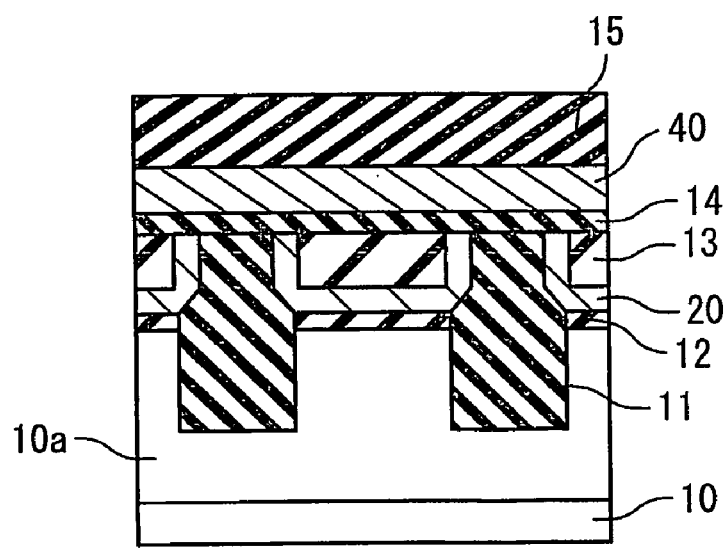

Subsequently, referring to FIGS. 21A and 21B, ions of the n-type impurities are implanted in a self-aligning manner at a position on the surface of the well 10a where the second source/drain diffusion layer 52 is formed. In this manner, the low concentration layer 52b of the second source/drain diffusion layer 52 is formed. Next, an oxide film is formed on an entire surface by the CVD method, and the oxide film is etched back. In this manner, the first side wall insulating film 16 is formed on a side surface opposite to the second side wall insulating film 17 of the control gate 30. After that, ions of the n-type impurities are implanted in a self-aligning manner at a position on the surface of the well 10a where the second source/drain diffusion layer 52 is formed. In this manner, the high concentration layer 52a of the second source/drain diffusion layer 52 is formed.

Figure 22A:
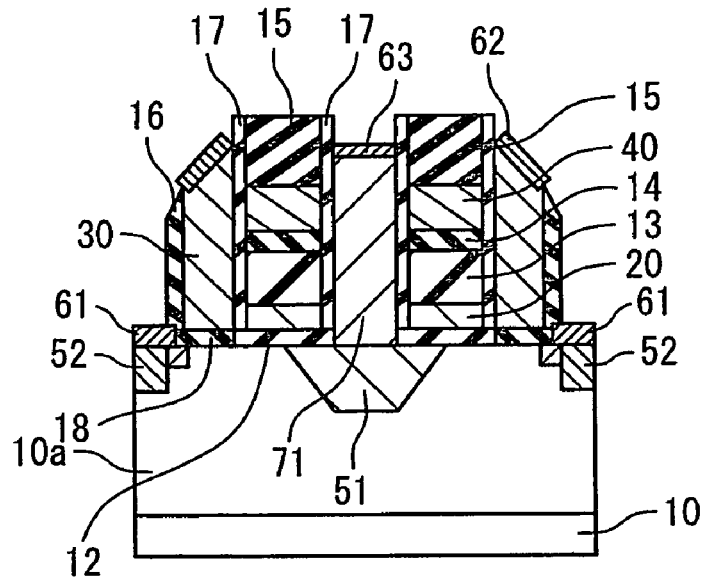
Figure 22B:
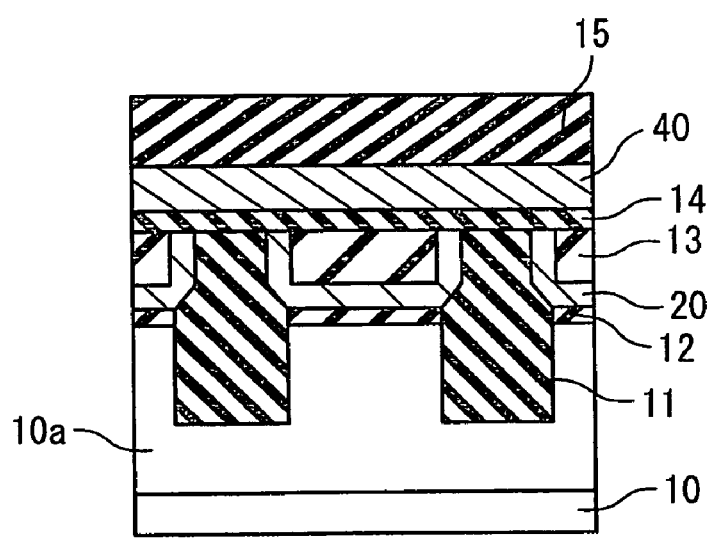

Next, referring to FIGS. 22A and 22B, a cobalt film is formed on an entire surface, and the heat treatment is performed. After that, the cobalt film is removed by the etching. In this manner, the silicide layers 61, 62, and 63 are formed on the second source/drain diffusion layer 52, the control gate 30, and the contact plug 71, respectively.

As explained above, the nonvolatile semiconductor memory device is manufactured in the above-described process.

In the method of manufacturing the nonvolatile semiconductor memory device according to the present embodiment, a shape in an x-z cross-section of the floating gate 20 can be formed in the self-aligning manner on the isolating layer 11 by formation of the polysilicon film 20a between the isolating layers 11 and by the subsequent CMP process. In addition, y-z cross-sectional shapes of the floating gate 20 and the erasing gate 40 can be formed in the self-aligning manner with each other by sequentially etching the polysilicon film 20a and the polysilicon film 40a. Furthermore, the contact plug 71 on the first source/drain diffusion layer 51 also can be formed in the self-aligning manner with respect to the floating gate 20 and erasing gate 40 by growth and an etching back process of the polysilicon film 30a. Accordingly, mask aligning margins in the lithography process are eliminated by the above mentioned self-aligning processes, and a memory size can be reduced.

In the nonvolatile semiconductor memory device according to the present embodiment, the floating gate 20 faces the erasing gate 40 via the tunnel insulating film 14 in the end portion 21. Other portions face the erasing gate 40 across a relatively thick insulating film (the tunnel insulating film 14 and the first insulating film 13). Accordingly, a portion practically effective to a coupling capacity between the floating gate 20 and the erasing gate 40 is the end portion 21. Since this end portion 21 has a quite small area which faces the erasing gate 40, the coupling capacity between the floating gate 20 and the erasing gate 40 is quite small. As the result, the erasing voltage in the erasing operation can be suppressed to be small.

In addition, in the nonvolatile semiconductor memory device according to the present embodiment, the erasing gate 40 is provided not on the first and second source/drain diffusion layers 51 and 52 but directly on the floating gate 20, and the tunnel insulating film 14 and the erasing gate 40 are formed before the control gate 30 is formed. Accordingly, upper portions of the second source/drain diffusion layer 52, the control gate 30, and the contact plug 71 on the first source/drain diffusion layer 51 can be silicided. As the result, a parasitic resistance can be reduced and a high speed reading can be realized.

A Second Embodiment

Compared to the first embodiment, a second embodiment of the present invention is different from the first embodiment in shapes of the erasing gate 40 and a tunnel insulating film and in a part of the manufacturing method. The different points will be explained below.

Figure 23A:
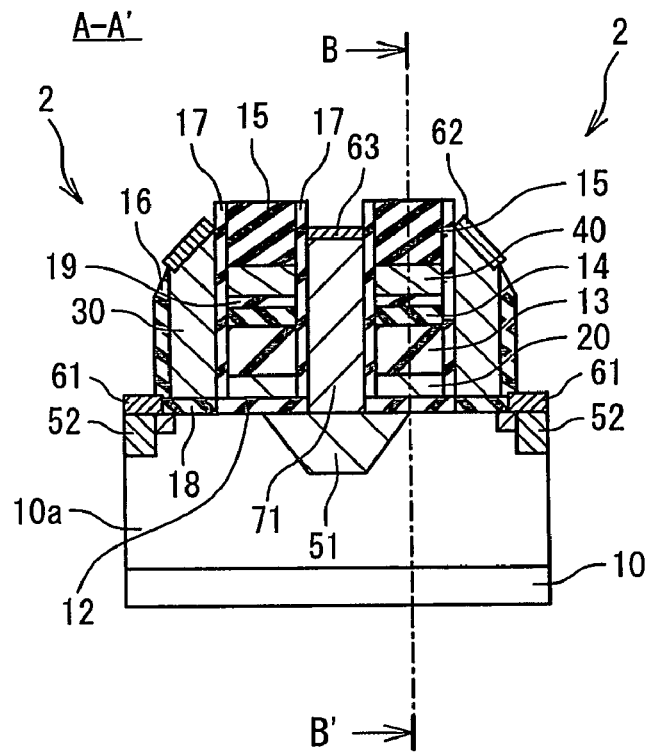
FIG. 23A is a cross-sectional view showing a configuration of a nonvolatile semiconductor memory device according to another embodiment of the present invention.
Figure 23B:
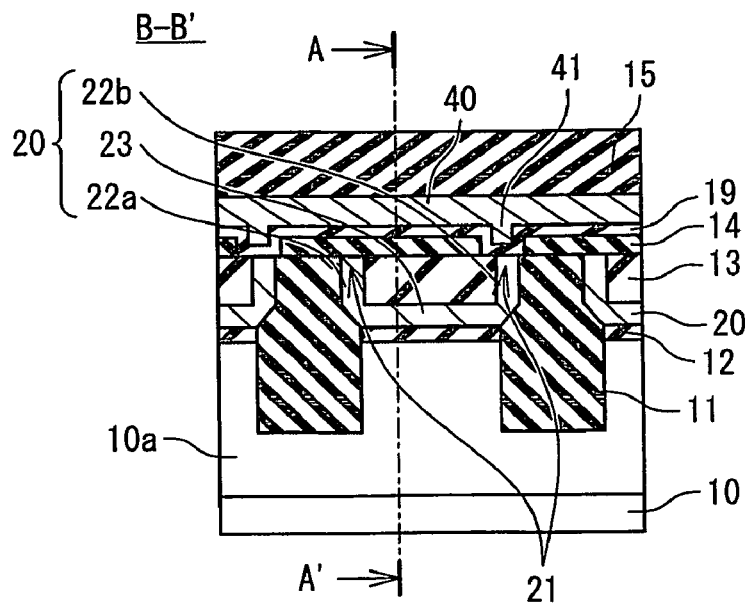
FIG. 23B is a cross-sectional view showing the configuration of the nonvolatile semiconductor memory device according to the other embodiment of the present invention.

FIGS. 23A and 23B are views showing a configuration of a nonvolatile semiconductor memory device according to the embodiment of the present invention. Specifically, FIG. 23A is a cross-sectional view along the line A-A' (y-z cross-section) shown in FIG. 23B, FIG. 23B is a cross-sectional view along the line B-B' (z-x cross-section) shown in FIG. 23A. In addition, a plan view (x-y plane) is the same as that in FIG. 4C. In the figures, the memory cell 2 of a split-gate flash memory is shown as an example of a memory cell of the nonvolatile semiconductor memory device according to the present embodiment.

As for a cross-sectional view along the line A-A' (y-z cross-section) shown in FIG. 23B, since the nonvolatile semiconductor memory device of the present embodiment is the same as that in FIG. 4A in the first embodiment, explanation thereof will be omitted.

As for a cross-sectional view along the line B-B' (x-y cross-section) shown in FIG. 23A, the nonvolatile semiconductor memory device of the present embodiment is different from the first embodiment in shapes of the erasing gate 40 and the tunnel insulating film. That is, the tunnel insulating film reduces own thickness at an upper portion of one of the end portions 21 of the floating gate 20 compared to another of the end portions 21, and forms a concave portion On the other hand, the erasing gate 40 forms a convex portion 41 above one of the end portions 21 (e.g.: the second side portion 22b) so as to in fill the concave portion. Accordingly, the erasing gate 40 and the floating gate 20 face with each other via the tunnel insulating film 19 thinner than the tunnel insulating film 14 of the first embodiment. In this manner, by reducing a film thickness of the tunnel insulating film between the erasing gate 40 and the floating gate 20 (shortening a distance between the both gates), the coupling capacity can be further reduced. Accordingly, the erasing voltage in the erasing operation can be suppressed to be small.

Specifically, the tunnel insulating film has a two-layer structure, and includes the tunnel insulating film 14 and the second tunnel insulating film 19. The tunnel insulating film 14 is provided on the floating gate 20 and the first insulating film 13. However, the tunnel insulating film 14 is etched and removed at an upper portion of one of the end portions 21. Accordingly, the tunnel insulating film has a concave portion at an upper portion of one of the end portions 21 as a whole. On the other hand, the tunnel insulating film 19 entirely coats the tunnel insulating film 14 including the upper portion of one of the end portions 21. A thickness of the tunnel insulating film 19 is thinner than that of the tunnel insulating film 14. Accordingly, the erasing gate 40 and one of the end portions 21 of the floating gate 20 (e.g.: the second side portion 22b) face with each other via the thin tunnel insulating film 19 in the concave portion. Consequently, in the insulating layer between the erasing gate 40 and the floating gate 20, a portion contacting the first side portion 22a (the tunnel insulating film 14 and the tunnel insulating film 19) is thicker by a thickness of the tunnel insulating film 14 than a portion contacting the second side portion 22b (the tunnel insulating film 19).

Since it is enough for the floating gate 20 to have at least one portion facing the erasing gate 40 via the tunnel insulating film, the first side portion 22a is not necessarily needed. In that case, the floating gate 20 is L-shaped. However, when having the end portion 21 facing the erasing gate 40 via the tunnel insulating film 14, the floating gate 20 is not necessarily required to be accurately L-shaped. In the case where the floating gate 20 is L-shaped, since the coupling capacity can be further reduced in comparison with a case of the U-shaped, the erasing voltage in the erasing operation can be suppressed to be further small.

Since other configurations are the same as those of the first embodiment, explanations thereof will be omitted.

Next, a method of manufacturing the nonvolatile semiconductor memory device according to the embodiment of the present invention will be explained. At first, the steps of FIG. 9A and FIGS. 9B to 14A and FIG. 14B shown in the first embodiment are processed.

Figure 14A:
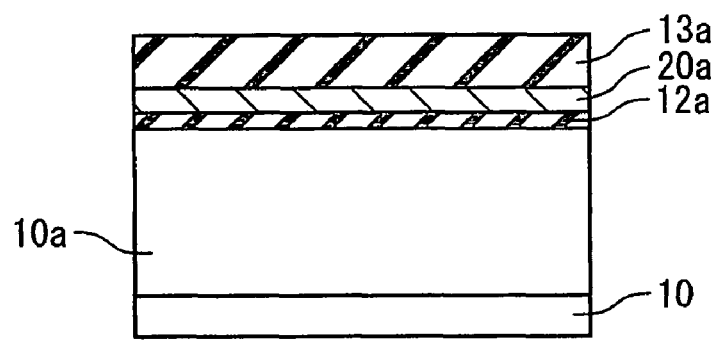
Figure 14B:
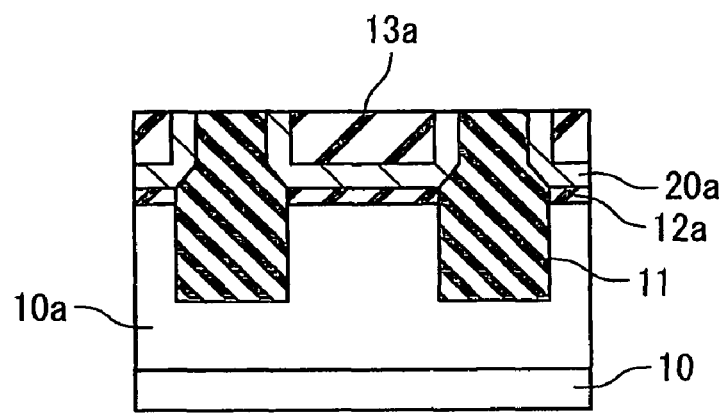
Figure 24A:
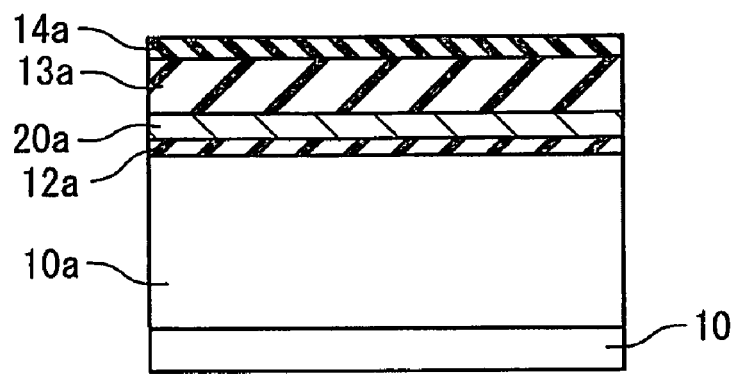
FIGS. 24A to 27B are cross-sectional views, each of which shows each step in the method for manufacturing the nonvolatile semiconductor memory device according to the other embodiment of the present invention.
Figure 24B:
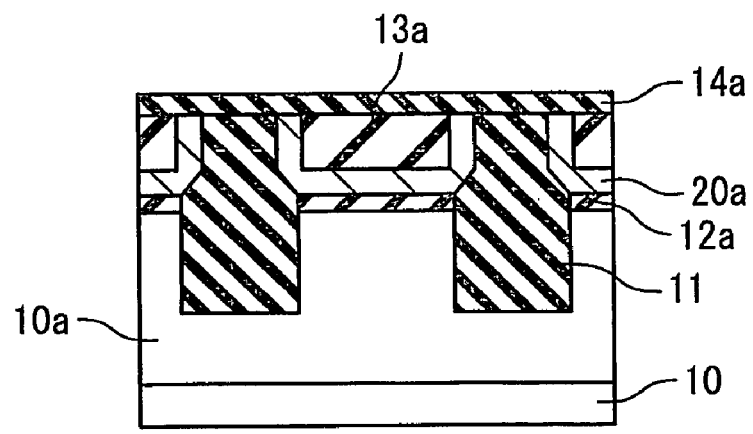
Figure 25A:
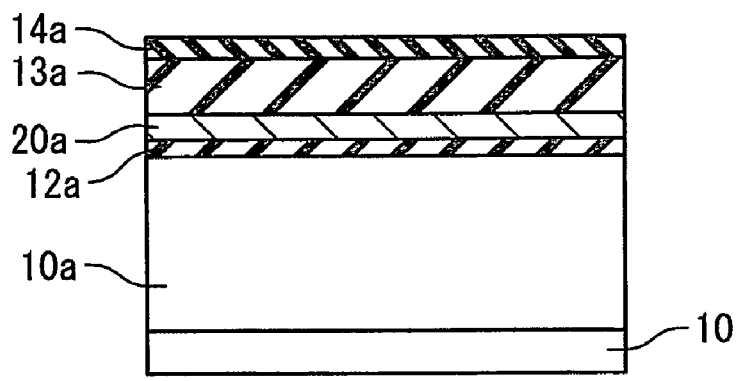
Figure 25B:
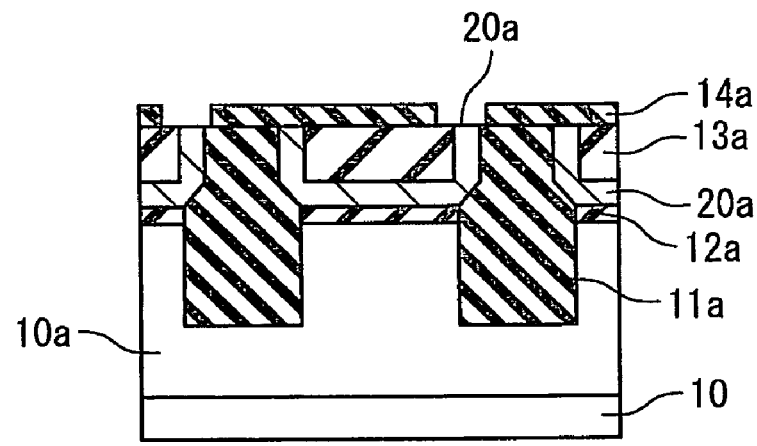

After the steps of FIGS. 14A and 14B, referring to FIGS. 24A and 24B, the oxide film 14a is formed by the CVD method so as to coat the polysilicon film 20a and the oxide film 13a. Next, referring to FIGS. 25A and 25B, a mask pattern at a position of the upper portion of one of the end portions 21 of the floating gate 20 is formed by the photoresist. And, the oxide film 14a is etched by applying the photoresist to a mask. As the result, the upper portion of one of the end portions 21 of the floating gate 20 is exposed.

Figure 26A:
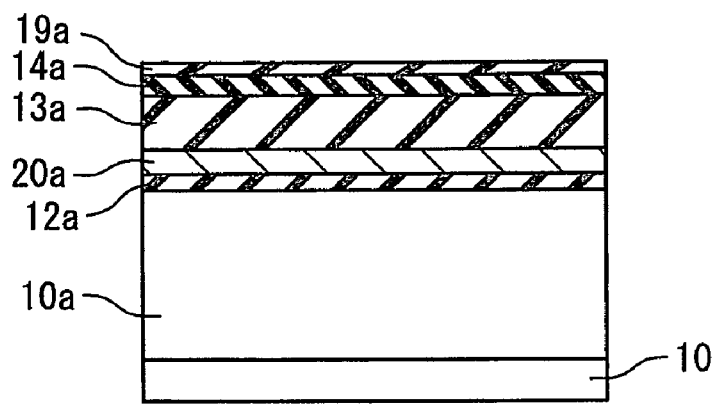
Figure 26B:
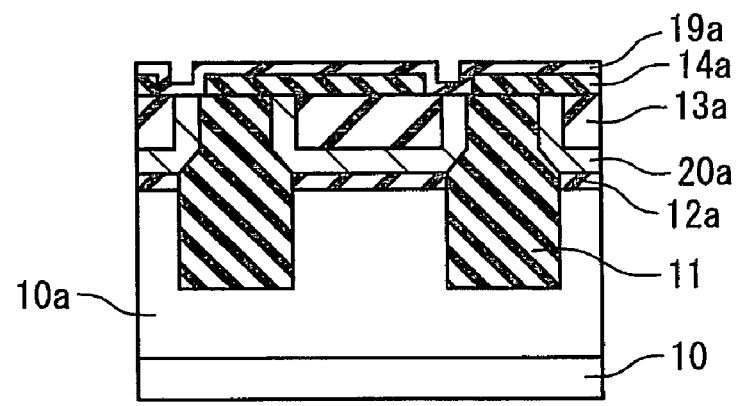
Figure 27A:
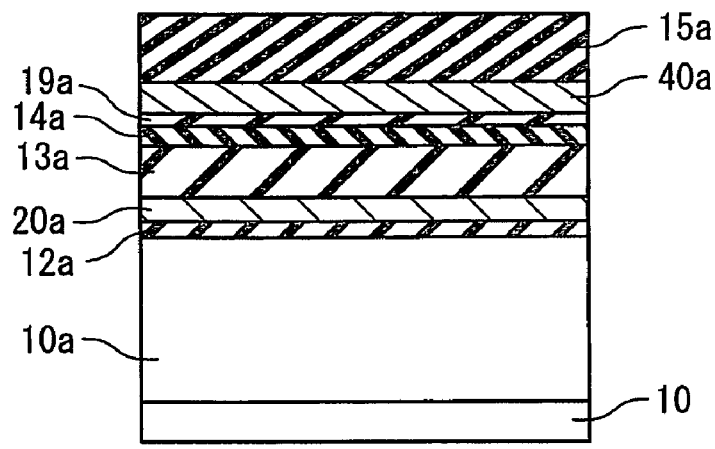
Figure 27B:
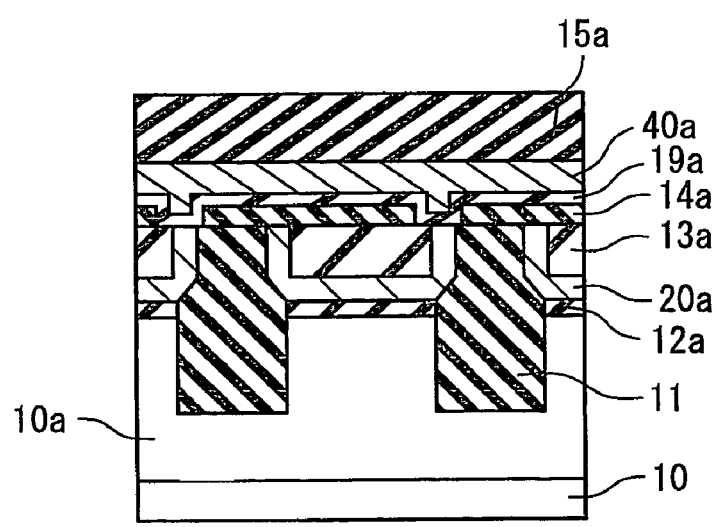

Subsequently, referring to FIGS. 26A and 26B, an oxide film 19a is formed by the CVD method so as to coat the oxide film 14a including the upper portion of one of the end portions 21. After that, referring to FIGS. 27A and 27B, the polysilicon film 40a is formed on the oxide film 19a by the CVD method. Subsequently, the oxide film 15a for the hard mask is formed on the polysilicon film 40a by the CVD method. These oxide film 19a, the oxide film 14a, the polysilicon film 40a, and the oxide film 15a are processed to be the second tunnel insulating film 19, the tunnel insulating film 14, the erasing gate 40, and the second insulating film 15 respectively by following steps.

As following steps, the steps after FIGS. 15A and 15B in the first embodiment are performed. The nonvolatile semiconductor memory device is manufactured in the above described process.

Also in the nonvolatile semiconductor memory device according to the embodiment, the effect described in the first embodiment can be obtained. In addition, by reducing a film thickness of the tunnel insulating film between the erasing gate 40 and the floating gate 20 (shortening a distance between the both gates), the coupling capacity between the erasing gate 40 and the floating gate 20 can be further reduced. Accordingly, the erasing voltage in the erasing operation can be suppressed to be small.

The above described respective embodiments show a case where the floating gate 20 is U-shaped or L-shaped and the number of the end portions for emitting electrons is two or one. However, if the coupling capacity can be suppressed to be sufficiently small, a plurality of the end portions (three or more) may be employed.

As shown above, the present invention includes a method of manufacturing a nonvolatile semiconductor memory device, as described below.

The method of manufacturing a nonvolatile semiconductor memory device, includes: forming a plurality of trenches, each of which penetrates through a protecting insulating film coating a semiconductor substrate and reaches inside of the semiconductor substrate; forming isolating layers in the plurality of trenches and removing the protecting insulating film; forming a gate insulating film, a first conductive film and first insulating film; evenly removing the first insulating film and the first conductive film such that upper portions of the isolating layers are exposed; forming a second insulating film and a second conductive film; forming an erasing gate and a floating gate by etching the second conductive film, the second insulating film, the first insulating film and the first conductive film to have a predetermined pattern; and forming a control gate through a third insulating film beside the floating gate and the erasing gate.

In the method of manufacturing a nonvolatile semiconductor memory device, described above, the step of evenly removing the first insulating film and the first conductive film, includes: forming the first conductive film to be U-shaped by removing the first conductive film on the isolating layers.

In the method of manufacturing a nonvolatile semiconductor memory device, described above, the step of forming the second insulating film and the second conductive film, includes: forming the second insulating film, in which a thickness of a portion contacting with one of both ends of the U-shaped is larger than a thickness of a portion contacting with the other of the both ends.

In the method of manufacturing a nonvolatile semiconductor memory device, described above, the step of forming the control gate, includes: forming a third insulating layer configured to be a lamination film of a silicon oxide film, a silicon nitride film and a silicon oxide film.

The method of manufacturing a nonvolatile semiconductor memory device, described above, further includes: forming a first silicide layer on one of source drain regions provided on both side of the channel region, a second silicide layer on the other of the source drain regions, and a third silicide layer on the control gate.

Obviously, the present invention is not limited to the above mentioned respective embodiments, and the respective embodiments can be arbitrarily modified or changed within the scope of technical ideas of the present invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A nonvolatile semiconductor memory device, comprising:
    a floating gate configured to be provided on a channel region of a semiconductor substrate through a first insulating layer;
    an erasing gate configured to be provided on said floating gate through a second insulating layer; and
    a control gate configured to be provided beside said floating gate and said erasing gate through a third insulating layer,
    wherein said floating gate is U-shaped.

2. The nonvolatile semiconductor memory device according to claim 1, wherein said floating gate faces said erasing gate at both ends of said U-shaped through said second insulating layer.

3. The nonvolatile semiconductor memory device according to claim 1, wherein in said second insulating layer, a thickness of a portion contacting with each of both ends of said U-shaped is larger than a thickness of other portions.

4. The nonvolatile semiconductor memory device according to claim 1, wherein in said second insulating layer, a thickness of a portion contacting with one of both ends of said U-shaped is larger than a thickness of a portion contacting with the other of said both ends.

5. The nonvolatile semiconductor memory device according to claim 1, wherein said third insulating layer includes:
    a lamination layer configured to include a silicon oxide film and a silicon nitride film.

6. The nonvolatile semiconductor memory device according to claim 1, further comprising:
    source drain regions configured to be provided on both sides of said channel region;
    a first silicide layer configured to be provided on one of said source drain regions;
    a second silicide layer configured to be provided on the other of said source drain regions; and
    a third silicide layer configured to be provided on said control gate.

7. A nonvolatile semiconductor memory device, comprising:
    a floating gate configured to be provided on a channel region of a semiconductor substrate through a first insulating layer;
    an erasing gate configured to be provided on said floating gate through a second insulating layer; and
    a control gate configured to be provided beside said floating gate and said erasing gate through a third insulating layer,
    wherein said floating gate includes:
    a bottom surface portion configured to contact with said first insulating layer,
    a first side portion configured to be connected to one end of said bottom surface portion at one end, and extend toward a direction away from a surface of said semiconductor substrate, and
    a second side portion configured to be connected to the other end of said bottom surface portion at one end, and extend toward said direction away from said surface of said semiconductor substrate.

8. The nonvolatile semiconductor memory device according to claim 7, wherein said floating gate faces said erasing gate at the other end of said first side portion and the other end of said second side portion through said second insulating layer.

9. The nonvolatile semiconductor memory device according to claim 7, wherein in said second insulating layer, a thickness of a portion contacting with said bottom surface portion is larger than a thickness of a portion contacting with each of the other end of said first side portion and the other end of said second side portion.

10. The nonvolatile semiconductor memory device according to claim 7, wherein in said second insulating layer, a thickness of a portion contacting with one of the other end of said first side portion and the other end of said second side portion is larger than a thickness of a portion contacting with the other of said the other end of said first side portion and said the other end of said second side portion.

11. The nonvolatile semiconductor memory device according to claim 7, wherein said third insulating layer includes:
    a lamination layer configured to include a silicon oxide film and a silicon nitride film.

12. The nonvolatile semiconductor memory device according to claim 7, further comprising:
    source drain regions configured to be provided on both sides of said channel region;

a first silicide layer configured to be provided on one of said source drain regions;
a second silicide layer configured to be provided on the other of said source drain regions; and
a third silicide layer configured to be provided on said control gate.

13. A nonvolatile semiconductor memory device, comprising:
a floating gate configured to be provided on a channel region of a semiconductor substrate through a first insulating layer;
an erasing gate configured to be provided on said floating gate through a second insulating layer; and
a control gate configured to be provided beside said floating gate and said erasing gate through a third insulating layer,
wherein said floating gate is L-shaped.

14. The nonvolatile semiconductor memory device according to claim 13, wherein said floating gate faces said erasing gate at one end of said L-shaped through said second insulating layer.

15. The nonvolatile semiconductor memory device according to claim 14, wherein in said second insulating layer, a thickness of a portion contacting with a portion facing said first insulating layer in said floating gate is larger than a thickness of a portion contacting with a portion facing said erasing gate in said floating gate.

16. The nonvolatile semiconductor memory device according to claim 13, wherein said third insulating layer includes:
a lamination layer configured to include a silicon oxide film and a silicon nitride film.

17. The nonvolatile semiconductor memory device according to claim 13, further comprising:
source drain regions configured to be provided on both sides of said channel region;
a first silicide layer configured to be provided on one of said source drain regions;
a second silicide layer configured to be provided on the other of said source drain regions; and
a third silicide layer configured to be provided on said control gate.

* * * * *